(12) United States Patent
Choi et al.

(10) Patent No.: US 11,670,559 B2
(45) Date of Patent: Jun. 6, 2023

(54) SEMICONDUCTOR DEVICE

(71) Applicant: SAMSUNG ELECTRONICS CO., LTD., Suwon-si (KR)

(72) Inventors: Minjung Choi, Suwon-si (KR); Jung-Hoon Han, Hwaseong-si (KR); Jiho Kim, seoul (KR); Young-Yong Byun, Seoul (KR); Yeonjin Lee, Suwon-si (KR); Jihoon Chang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/206,295

(22) Filed: Mar. 19, 2021

(65) Prior Publication Data
US 2021/0305115 A1    Sep. 30, 2021

(30) Foreign Application Priority Data

Mar. 27, 2020   (KR) .................. 10-2020-0037779
Nov. 20, 2020   (KR) .................. 10-2020-0156359

(51) Int. Cl.
*H01L 23/48*   (2006.01)
*H01L 23/31*   (2006.01)
(Continued)

(52) U.S. Cl.
CPC ...... *H01L 23/3171* (2013.01); *H01L 23/3192* (2013.01); *H01L 23/528* (2013.01);
(Continued)

(58) Field of Classification Search
CPC ................. H01L 23/291–296; H01L 2224/02181–05553; H01L 23/528; H01L 23/3192; H01L 23/3171
See application file for complete search history.

(56) References Cited

U.S. PATENT DOCUMENTS 6,017,780 A  *  1/2000  Roy ................. G02F 1/136227
                                         257/E21.244
6,211,570 B1    4/2001  Kakamu
(Continued)

FOREIGN PATENT DOCUMENTS

KR    10-2006-0084649 A    7/2006
KR    10-2009-0103197 A    10/2009

*Primary Examiner* — Hoa B Trinh
(74) *Attorney, Agent, or Firm* — Lee IP Law, P.C.

(57) ABSTRACT

A semiconductor device including a substrate including a chip region and an edge region; integrated circuit elements on the chip region; an interlayer insulating layer covering the integrated circuit elements; an interconnection structure on the interlayer insulating layer and having a side surface on the edge region; a first and second conductive pattern on the interconnection structure, the first and second conductive patterns being electrically connected to the interconnection structure; a first passivation layer covering the first and second conductive patterns and the side surface of the interconnection structure; and a second passivation layer on the first passivation layer, wherein the second passivation layer includes an insulating material different from the first passivation layer, and, between the first and second conductive patterns, the second passivation layer has a bottom surface that is located at a vertical level lower than a top surface of the first conductive pattern.

20 Claims, 20 Drawing Sheets

(51) Int. Cl.
   *H01L 23/528*   (2006.01)
   *H01L 23/00*    (2006.01)
   *H01L 23/58*    (2006.01)
   *H01L 23/29*    (2006.01)
   *H01L 21/78*    (2006.01)

(52) U.S. Cl.
   CPC ............ *H01L 21/78* (2013.01); *H01L 23/291* (2013.01); *H01L 23/296* (2013.01); *H01L 23/585* (2013.01); *H01L 24/05* (2013.01); *H01L 2224/0219* (2013.01); *H01L 2224/0221* (2013.01); *H01L 2224/02181* (2013.01); *H01L 2224/05541* (2013.01); *H01L 2224/05553* (2013.01)

(56) References Cited

U.S. PATENT DOCUMENTS

| | | | |
|---|---|---|---|
| 7,781,798 B2 | 8/2010 | Kobayashi et al. | |
| 9,576,909 B2 | 2/2017 | Teh et al. | |
| 10,553,479 B2 | 2/2020 | Yen et al. | |
| 11,296,011 B2 * | 4/2022 | Lin | H01L 23/49827 |
| 2004/0235272 A1 | 11/2004 | Howard et al. | |
| 2010/0084747 A1 * | 4/2010 | Chen | H01L 21/76816 |
| | | | 257/E23.141 |

* cited by examiner

SEMICONDUCTOR DEVICE

CROSS-REFERENCE TO RELATED APPLICATION

Korean Patent Application Nos. 10-2020-0037779, filed on Mar. 27, 2020 and 10-2020-0156359, filed on Nov. 20, 2020 in the Korean Intellectual Property Office, both entitled: "Semiconductor Device," are incorporated by reference herein in their entirety.

BACKGROUND

1. Field

Embodiments relate to a semiconductor device.

2. Description of the Related Art

A semiconductor package may include a semiconductor chip configured to store a massive amount of data and to process a massive amount of stored data in a short time. The semiconductor chip may include an internal integrated circuit to store or process data, and chip pads to exchange data with an external device.

SUMMARY

The embodiments may be realized by providing a semiconductor device including a substrate including a chip region and an edge region around the chip region; integrated circuit elements on the chip region; an interlayer insulating layer covering the integrated circuit elements; an interconnection structure having internal interconnection lines on the interlayer insulating layer, the interconnection structure having a side surface on the edge region; a first conductive pattern and a second conductive pattern on the interconnection structure, the first conductive pattern and the second conductive pattern being electrically connected to the internal interconnection lines; a first passivation layer covering the first conductive pattern and the second conductive pattern and the side surface of the interconnection structure; and a second passivation layer on the first passivation layer, wherein the second passivation layer includes a second insulating material, the first passivation layer includes a first insulating material, and the second insulating material of the second passivation layer is different from the first insulating material of the first passivation layer, and in a region between the first conductive pattern and the second conductive pattern, the second passivation layer has a bottom surface that is located at a vertical level lower than a top surface of the first conductive pattern.

The embodiments may be realized by providing a semiconductor device including a substrate; integrated circuit elements on the substrate; an interlayer insulating layer covering the integrated circuit elements; an interconnection structure on the interlayer insulating layer, the interconnection structure including internal interconnection lines connected to the integrated circuit elements; conductive patterns on the interconnection structure, the conductive patterns being electrically connected to the internal interconnection lines; a first passivation layer covering the conductive patterns and a side surface of the interconnection structure; and a second passivation layer on the first passivation layer, wherein the second passivation layer includes an insulating material, the first passivation layer includes an insulating material, and the insulating material of the second passivation layer is different from the insulating material of the first passivation layer, in a region between the conductive patterns, the first passivation layer has a thickness that is smaller than a thickness of the second passivation layer, and in a region on a top surface of each of the conductive patterns, the first passivation layer has a thickness that is larger than a thickness of the second passivation layer.

The embodiments may be realized by providing a semiconductor device including a substrate including a chip region and an edge region around the chip region; integrated circuit elements on the chip region of the substrate; an interlayer insulating layer covering the integrated circuit elements; an interconnection structure on the interlayer insulating layer, the interconnection structure having a side surface on the edge region of the substrate; conductive patterns on a top surface of the interconnection structure, the conductive patterns being electrically connected to internal interconnection lines in the interconnection structure; a protection layer covering the conductive patterns; and passivation layers on the protection layer, the passivation layers having an opening partially exposing top surfaces of the conductive patterns, wherein the passivation layers include a first passivation layer on the protection layer and covering at least a portion of the side surface of the interconnection structure; a second passivation layer on the first passivation layer and including an insulating material different from that of the first passivation layer; and a third passivation layer on the second passivation layer and including an insulating material different from that of the first passivation layer and the second passivation layer, and wherein the conductive patterns have a thickness that is larger than a thickness of each of the first to third passivation layers.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
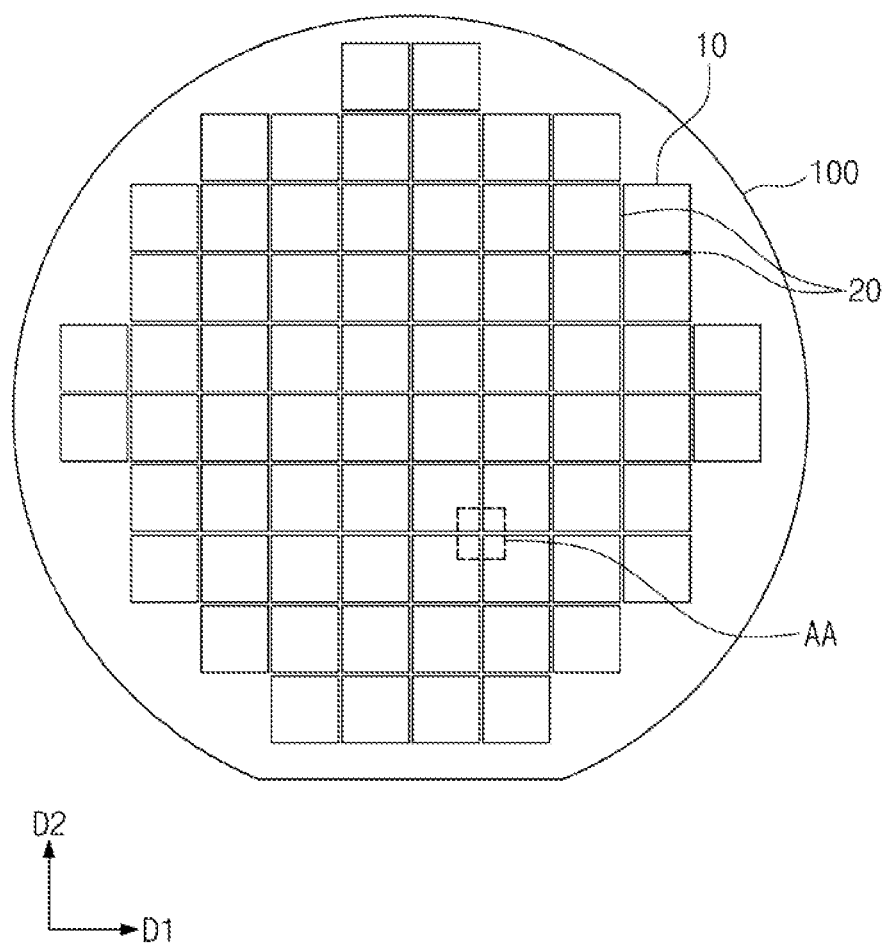
FIG. 1 is a substrate, on which semiconductor devices are integrated, according to an embodiment.
Figure 2:
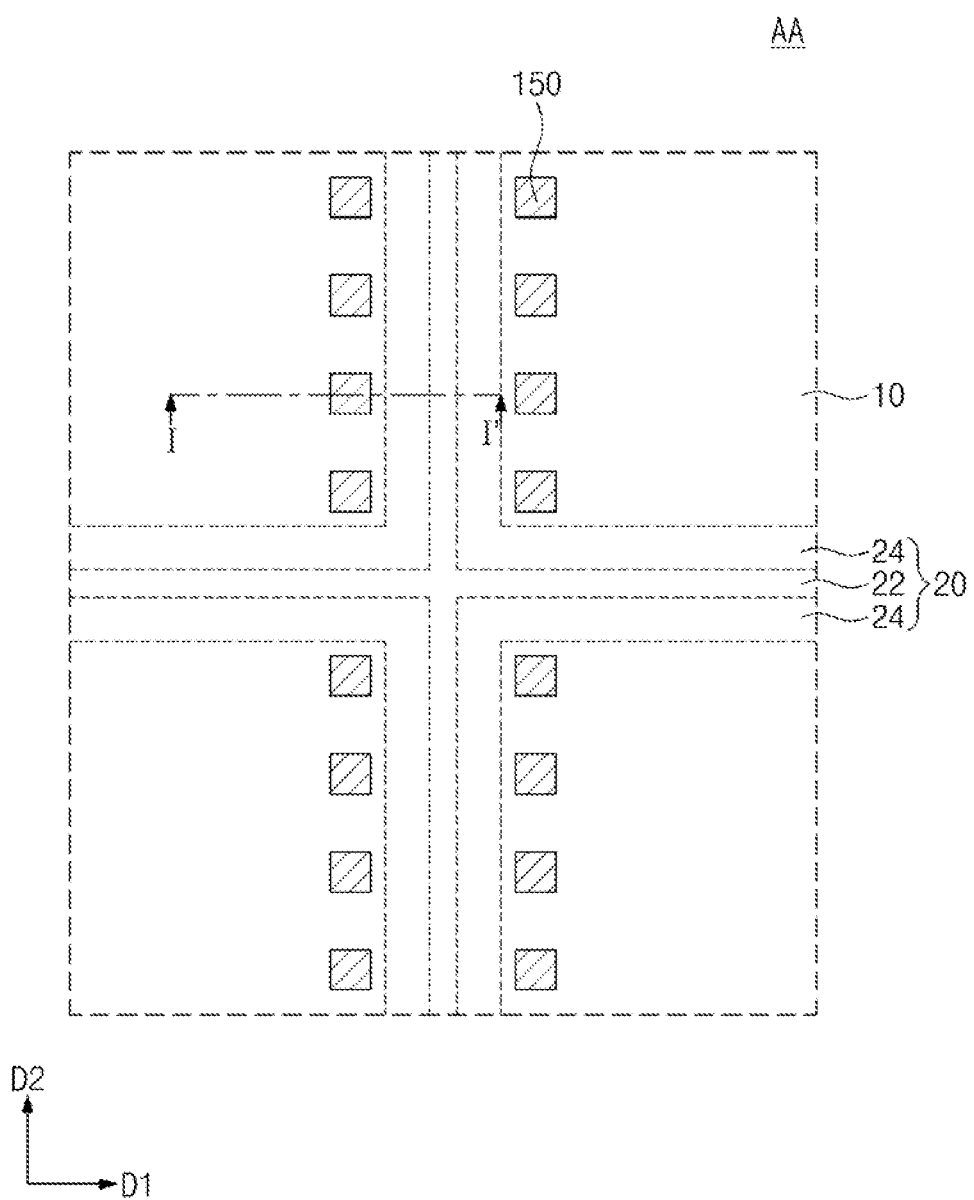
FIG. 2 is an enlarged plan view of a portion AA of FIG. 1.

FIG. 1 is a semiconductor substrate, on which semiconductor devices are integrated, according to an embodiment. FIG. 2 is an enlarged plan view of a portion AA of FIG. 1.

Referring to FIGS. 1 and 2, a substrate 100 may include chip regions 10, on which semiconductor integrated circuits are formed, and a scribe line region 20 between the chip regions 10.

The substrate 100 may include a semiconductor material (e.g., silicon), an insulating material (e.g., glass), or a semiconductor layer covered with an insulating material. In an implementation, the substrate 100 may be a silicon wafer.

The chip regions 10 may be two-dimensionally arranged in a first direction D1 and a second direction D2, which are perpendicular to each other. Each of the chip regions 10 may be enclosed or surrounded by the scribe line region 20.

The scribe line region 20 may be between the chip regions 10 and may extend in the first and second directions D1 and D2. The scribe line region 20 may include a cutting region 22, which will be cut by a sawing or dicing machine, and edge regions 24, which are between the cutting region 22 and the chip regions 10. The edge regions 24 may enclose the chip regions 10, respectively.

In an implementation, semiconductor memory devices, e.g., dynamic random access memory (DRAM), static random access memory (SRAM), NAND FLASH memory, or resistive random access memory (RRAM), may be on the chip regions 10 of the substrate 100. In an implementation, a micro-electro mechanical system (MEMS) device, an optoelectronic device, or a processor (e.g., CPU or DSP) may be on the chip regions 10 of the substrate 100. In an implementation, standard cells including semiconductor elements, such as OR gates or AND gates, may be on the chip regions 10 of the substrate 100.

Conductive patterns 150 may be in or on the chip regions 10 of the substrate 100. The conductive patterns may be chip pads to input or output data or signals to or from the integrated circuit. The conductive patterns 150 may also be referred to as the chip pads 150. Some of the chip pads 150 may be on a border of each of the chip regions 10. Others of the chip pads 150 may be on center portions of the chip regions 10.

FIGS. 3 to 6 are sectional views, which are taken along a line I-I' of FIG. 2, of stages in a method of fabricating semiconductor devices according to an embodiment. FIGS. 7A to 7C are enlarged sectional views, which correspond to a portion BB of FIG. 6, of stages in a method of fabricating semiconductor devices according to an embodiment. FIGS. 8 to 11 are sectional views, which are taken along the line I-I' of FIG. 2, of stages in a method of fabricating semiconductor devices according to an embodiment. FIGS. 12A and 12B are enlarged sectional views illustrating a portion CC of FIG. 11.

Figure 3:
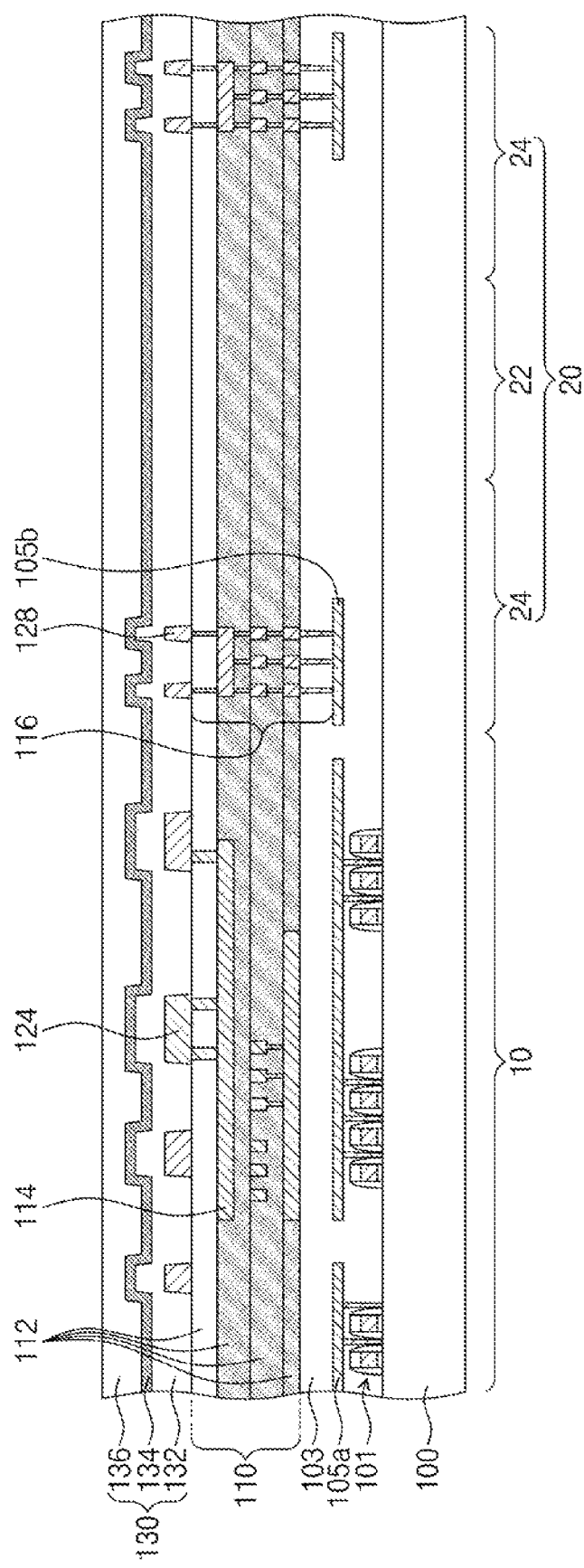
FIGS. 3 to 6 are sectional views, which are taken along a line of FIG. 2, of stages in a method of fabricating semiconductor devices according to an embodiment.

Referring to FIGS. 2 and 3, the substrate 100 may include the chip regions 10 and the scribe line region 20. The scribe line region 20 may include the cutting region 22 at its center portion, and the edge regions 24 between the cutting region 22 and the chip regions 10. The scribe line region 20 may extend in the first and second directions D1 and D2.

An integrated circuit element 101 may be on the chip region 10 of the substrate 100. The integrated circuit element 101 may include a memory cell array, in which switching elements and data storage elements are provided, and a logic region, in which MOS FETs, capacitors, and resistors are provided. The integrated circuit element 101 may be covered with an interlayer insulating layer 103, e.g., the interlayer insulating layer 103 may fully cover a top surface of the substrate 100. The interlayer insulating layer 103 may include a silicon oxide layer, a silicon nitride layer, or a silicon oxynitride layer. Lower interconnection lines 105a may be in the interlayer insulating layer 103. The lower interconnection lines 105a may be on the chip region 10 and may be connected to the integrated circuit element 101. Dummy lower interconnection lines 105b may be in the interlayer insulating layer 103. The dummy lower interconnection lines 105b may be in the edge region 24 and may be electrically disconnected or isolated from the integrated circuit element 101. The lower interconnection lines 105a and the dummy lower interconnection lines 105b may be formed of or include a metallic material (e.g., W, Ti, Ta, TiN, WN, or TaN). As used herein, the term "or" is not an exclusive term, e.g., "A or B" would include A, B, or A and B.

An interconnection structure 110 may be formed on the interlayer insulating layer 103. The interconnection structure 110 may include lower insulating layers 112 and internal interconnection lines 114 in the lower insulating layers 112.

The lower insulating layers 112 may be formed on the interlayer insulating layer 103 to fully cover the top surface of the substrate 100. The lower insulating layers 112 may include a plurality of stacked insulating layers. In an implementation, the lower insulating layers 112 may be formed of or include a low-k dielectric material whose dielectric constant is lower than silicon oxide. The lower insulating layers 112 may have a dielectric constant of about 1.0 to 3.0 and may include organic, inorganic, or organic-inorganic hybrid materials. In an implementation, the lower insulating layers 112 may be porous or non-porous. The lower insulating layers 112 may be formed of or include impurity-doped silicon oxide materials or low-k organic polymers. The impurity-doped oxide materials may include, e.g., fluorine-doped oxide (FSG), carbon-doped oxide, silicon oxide, hydrogen silsesquioxane (HSQ, SiO:H), methyl silsesquioxane (MSQ, SiO:CH$_3$), or a-SiOC (SiOC:H). The low-k organic polymers may include, e.g., polyallylether resins, cyclic fluoro resins, siloxane copolymers, fluorinated polyallylether resins, polypentafluorostylene, polytetrafluoro styrene resins, fluorinated polyimide resins, polynaphthalene fluoride, polycide resins, or the like. In an implementation, the lower insulating layers 112 may include at least two insulating layers, which are vertically stacked, and a barrier layer between the insulating layers. In an implementation, the barrier layer may be formed of or include an insulating material, e.g. SiN, SiON, SiC, SiCN, SiOCH, SiOC, or SiOF.

In an implementation, a topmost layer (e.g., layer farthest from the substrate 100) of the insulating layers constituting the lower insulating layers 112 may be formed of or include a material that is different from that of the others. The topmost insulating layer of the lower insulating layers 112 may be formed of or include, e.g., a silicon oxide layer, a silicon nitride layer, or a silicon oxynitride layer.

The internal interconnection lines 114 may be formed in the lower insulating layers 112 on the chip region 10. The internal interconnection lines 114 on the chip region 10 may be electrically connected to the integrated circuit element 101. The internal interconnection lines 114 may include metal lines extending in parallel to the top surface of the substrate 100, and metal vias vertically penetrating the lower insulating layers 112 and connecting the metal lines at different levels to each other. The metal lines and the metal vias may be formed of or include a first metallic material, e.g., W, Al, Ti, Ta, Co, or Cu. In an implementation, the metal lines and the metal vias may be formed of or include copper (Cu). The metal lines and the metal vias may further include a barrier metal layer, which may be formed of a metal nitride (e.g., TiN, WN, TaN, or TaSiN).

An inner chip pad 124 may be on a top surface (e.g., surface facing away from the substrate 100) of the lower insulating layers 112. The inner chip pad 124 may be on the chip region 10 and may be electrically connected to the internal interconnection lines 114 of the interconnection structure 110. The inner chip pad 124 may be electrically connected to the integrated circuit element 101 through the internal interconnection lines 114. The inner chip pad 124 may be a data pad to transmit or receive a data signal, a command/address pad to transmit or receive a command/address signal, a power pad to apply a ground or power voltage, or a test pad to test the integrated circuit element 101. The inner chip pad 124 may be formed of or include a second metallic material that is different from the first metallic material. The inner chip pad 124 may be formed of or include, e.g., W, Al, Ti, Ta, Co, or Cu. In an implementation, the inner chip pad 124 may be formed of or include aluminum (Al). The inner chip pad 124 may further include a barrier metal layer, which may be formed of a metal nitride (e.g., TiN, WN, TaN, or TaSiN).

A dam structure 116 may be formed on the edge region 24 of the substrate 100. The dam structure 116 may enclose each of the chip regions 10, when viewed in a plan view. The dam structure 116 may have a ring shape or a closed loop shape, when viewed in a plan view. At least a portion of the dam structure 116 may be formed using or during a process of forming the internal interconnection lines 114 on the chip region 10. The dam structure 116 may include dummy metal lines extending in the lower insulating layers 112 and parallel to the top surface of the substrate 100, and dummy metal vias vertically penetrating a portion of the lower insulating layers 112 and connecting the dummy metal lines at different levels.

A dummy inner chip pad 128 may be on the top surface of the lower insulating layers 112. The dummy inner chip pad 128 may be on the edge region 24 and may be connected to the dam structure 116. The dummy inner chip pads 128 may enclose each of the chip regions 10, when viewed in a plan view.

An upper insulating layer 130 may be formed to fully cover the top surface of the substrate 100. The upper insulating layer 130 may be formed on the topmost layer of the lower insulating layers 112 and may cover the inner chip pad 124 and the dummy inner chip pad 128. In an implementation, the upper insulating layer 130 may be formed of or include an insulating material whose mechanical durability is higher than that of the lower insulating layers 112. In an implementation, the upper insulating layer 130 may be formed of or include an insulating material whose dielectric constant is higher than that of the lower insulating layers 112. The upper insulating layer 130 may include a silicon oxide layer, a silicon nitride layer, or a silicon oxynitride layer. The upper insulating layer 130 may be formed of or include, e.g., silicon nitride (SiN), silicon oxynitride (SiON), SiCN, high density plasma (HDP) oxide, tetraethylorthosilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin-on-glass (SOG) materials, Tonen Silazene (TOSZ), or a combination thereof.

In an implementation, the upper insulating layer 130 may include a plurality of insulating layers. In an implementation, the upper insulating layer 130 may include a first upper insulating layer 132, a second upper insulating layer 134, and a third upper insulating layer 136, which may be sequentially stacked on the lower insulating layers 112. The second upper insulating layer 134 may be formed of an insulating material, may have an etch selectivity with respect to the first and third upper insulating layers 132 and 136, and may be thinner than the first and third upper insulating layers 132 and 136. The first and third upper insulating layers 132 and 136 may be formed of different insulating materials from each other. In an implementation, the first upper insulating layer 132 may be a high density plasma (HDP) oxide layer, the second upper insulating layer 134 may be a silicon nitride layer, and the third upper insulating layer 136 may be a tetraethyl orthosilicate (TEOS) layer.

Figure 4:
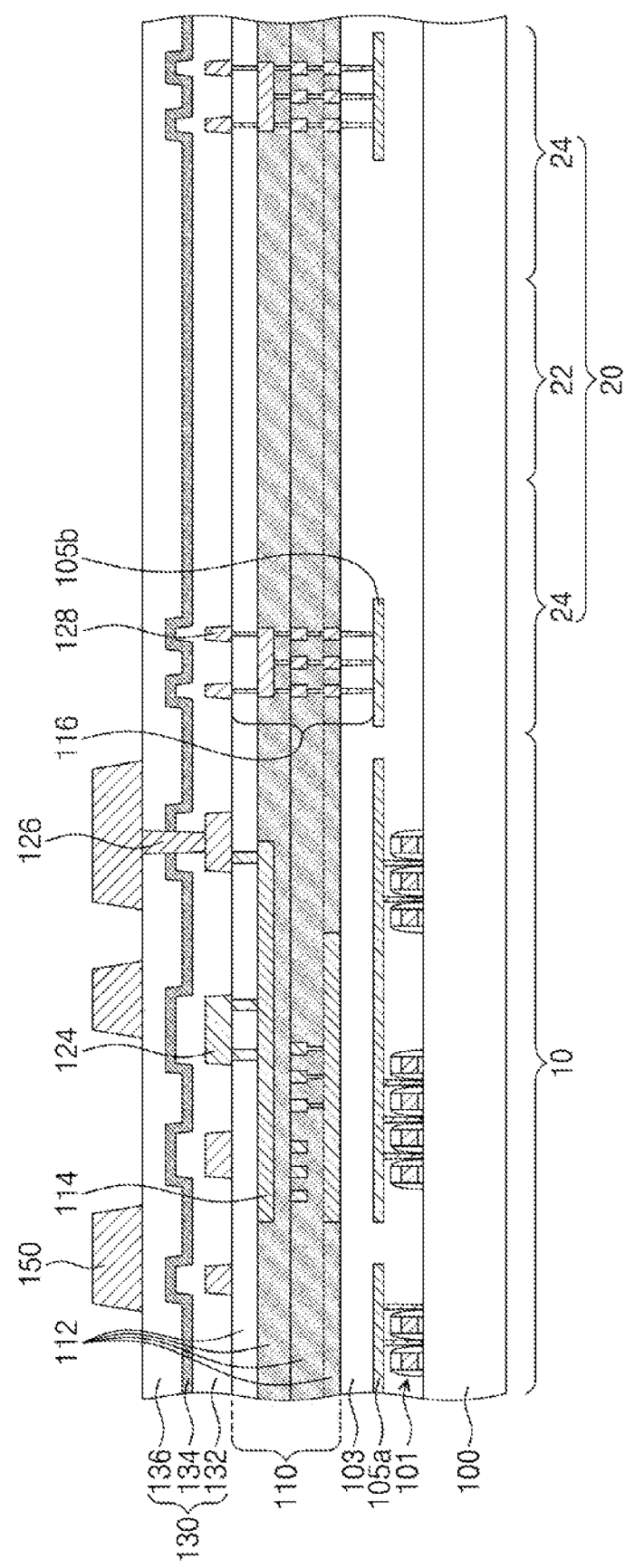

Referring to FIGS. 2 and 4, conductive patterns 150 may be formed on the interconnection structure 110. The formation of the conductive patterns 150 may include forming a metal layer to cover the interconnection structure 110 and patterning the metal layer to form the conductive patterns 150, which are electrically connected to the internal interconnection lines 114 in the interconnection structure 110.

The conductive patterns 150 may be (e.g., laterally) spaced apart from each other in a direction parallel to the top surface of the substrate 100. In an implementation, some of the conductive patterns 150 may be pads to electrically connect the integrated circuit elements 101 to the outside (e.g., of the device). Others of the conductive patterns 150 may be interconnection lines to electrically connect pads to each other or to electrically connect pads to the internal interconnection lines 114. The conductive patterns 150 may be formed of or include a first metallic material, e.g., W, Al, Ti, Ta, Co, or Cu. The conductive patterns 150 may be formed of or include, e.g., copper (Cu).

Upper vias 126 may be formed to connect the conductive patterns 150 to the inner chip pads 124. The upper via 126 may be formed before the formation of the conductive patterns 150. The upper via 126 may be formed to penetrate the first upper insulating layer 132, the second upper insulating layer 134, and the third upper insulating layer 136. A width of the upper via 126 may decrease, as a distance to the inner chip pads 124 decreases (e.g., the upper via 126 may have a downwardly tapered shape). The upper via 126 may be formed of or include the same material as the conductive patterns 150.

Figure 5:
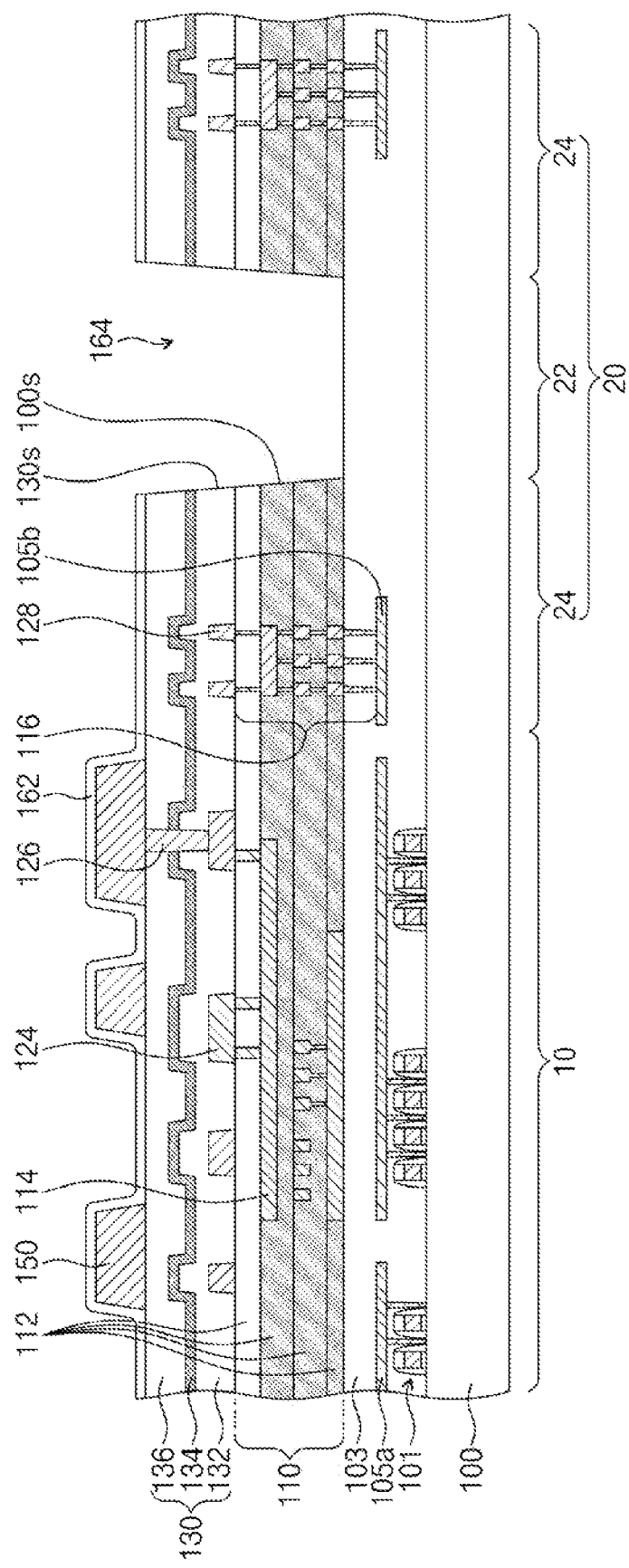

Referring to FIGS. 2 and 5, a protection layer 162 may be formed on the interconnection structure 110 and the conductive patterns 150, and a trench 164 may be formed on the cutting region 22 of the substrate 100.

The protection layer 162 may cover a top surface of the interconnection structure 110 and may cover side and top surfaces of the conductive patterns 150. A thickness of the protection layer 162 may be smaller than a thickness of the conductive patterns 150. The thickness of the protection layer 162 may range from 0.1 to 0.3 times the thickness of the conductive pattern 150. The protection layer 162 may be formed of or include silicon oxide. In an implementation, the protection layer 162 may be a PE-TEOS layer.

The trench 164 may be formed by removing a portion of the lower insulating layers 112, a portion of the upper insulating layer 130, and a portion of the protection layer 162. In an implementation, the formation of the trench 164 may include forming an etch mask on the protection layer 162 to expose the cutting region 22 and performing an etching process using the etch mask. The trench 164 may be formed to expose at least a portion of a top surface of the interlayer insulating layer 103. As a result of the formation of the trench 164, the lower and upper insulating layers 112 and 130 may have side surfaces 100s and 130s that are formed on the edge region 24. The side surfaces 100s and 130s of the lower and upper insulating layers 112 and 130 may be inclined at an angle with respect to the top surface of the substrate 100 (e.g., the trench 164 may have a downwardly tapered shape). The trench 164 may be formed along the cutting region 22 and may extend in the first and second directions D1 and D2 to enclose the chip region 10. A width of the trench 164 may decrease, as a distance to the top surface of the substrate 100 decreases.

Figure 6:
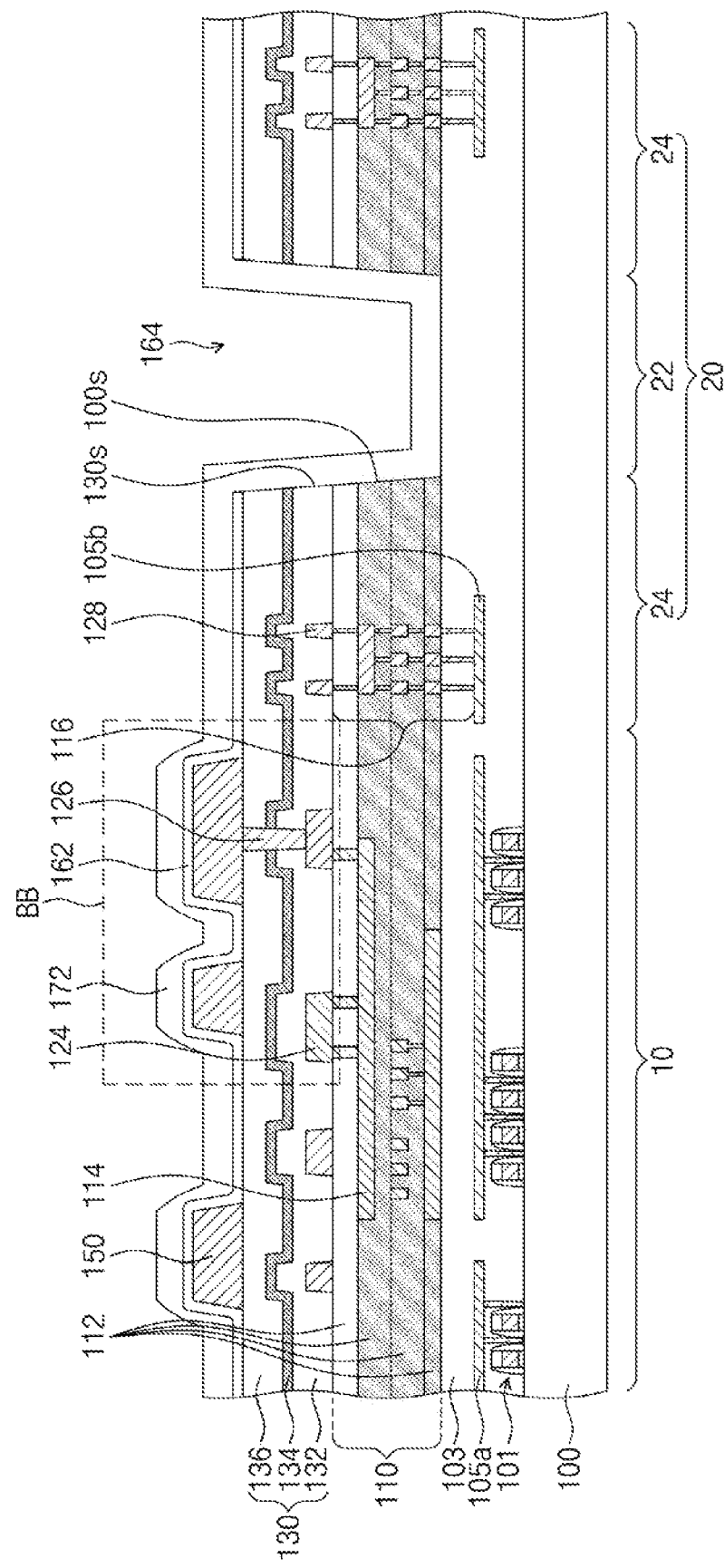
Figure 7A:
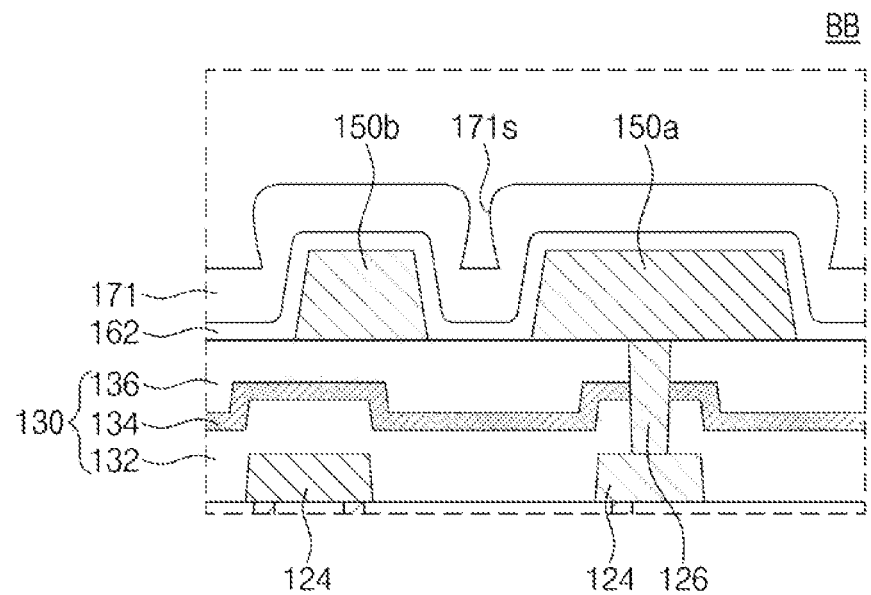
FIGS. 7A to 7C are enlarged sectional views, which correspond to a portion BB of FIG. 6, of stages in a method of fabricating semiconductor devices according to an embodiment.
Figure 7B:
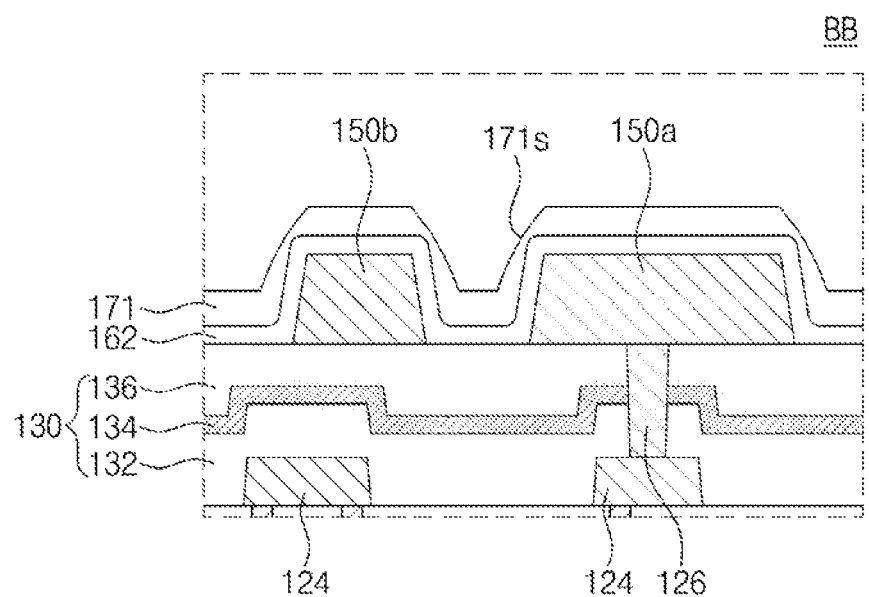
Figure 7C:
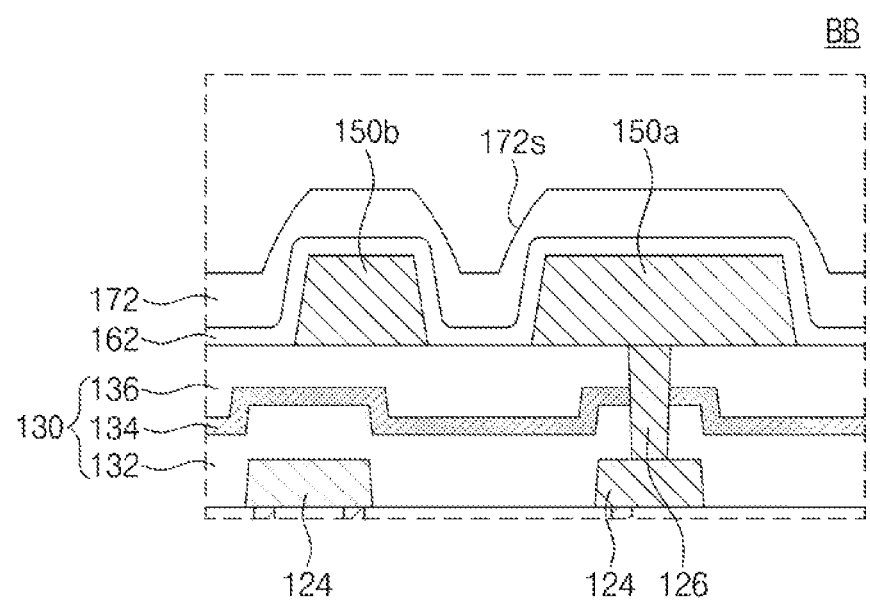

Referring to FIGS. 2 and 6, a first passivation layer 172 may be formed to cover the conductive patterns 150. The protection layer 162 may be between the first passivation layer 172 and the conductive patterns 150. The first passivation layer 172 may cover a top surface of the protection layer 162 on the chip region 10 and may have a non-constant (e.g., variable) thickness. The thickness of the protection layer 162 may be smaller than a thickness of the first passivation layer 172. In an implementation, a portion of the first passivation layer 172 on a side surface of the conductive patterns 150 may be thinner than a remaining portion of the first passivation layer 172. In an implementation, on the chip region 10, the first passivation layer 172 may have a top surface (e.g., surface facing away from the substrate 100), and a portion of the top surface may be located at a vertical level lower than (e.g., closer to the substrate 100 than) the top surface of each of the conductive patterns 150. On the cutting region 22, the first passivation layer 172 may cover inner side surfaces of the trench 164 and a portion of the top surface of the interlayer insulating layer 103 (e.g., a portion of the interlayer insulating layer 103 that was exposed at the bottom of the trench 164).

In an implementation, referring to FIG. 7A, a first deposition process may be performed to form a preliminary passivation layer 171 on the protection layer 162. The first deposition process may be performed using a high density plasma chemical vapor deposition (HDP-CVD) method. The preliminary passivation layer 171 may be formed to cover the protection layer 162, which may be on first and second conductive patterns 150a and 150b. The preliminary passivation layer 171 may have inner side surfaces 171s between the first and second conductive patterns 150a and 150b and protruding toward each other. A distance between the inner side surfaces 171s of the preliminary passivation layer 171 may increase with decreasing distance to a top surface of the upper insulating layer 130 (e.g., a gap between the inner side surfaces 171s of the preliminary passivation layer 171 may have a roughly trapezoidal shape). In an implementation, the inner side surfaces 171s of the preliminary passivation layer 171 may be connected to each other, and in this case, a void may be formed in the preliminary passivation layer 171.

Next, referring to FIG. 7B, an etching process may be performed on the preliminary passivation layer 171 to remove a portion of the preliminary passivation layer 171. The inner side surfaces 171s, which protruded toward each other, may be partially removed during the etching process. A maximum distance between the inner side surfaces 171s may be increased during the etching process. The etching process may be performed in such a way that the distance between the inner side surfaces 171s of the preliminary passivation layer 171 may decrease with decreasing distance to the upper insulating layer 130. The preliminary passivation layer 171 may be thinner on side surfaces of the first and second conductive patterns 150a and 150b than it is on top surfaces of the first and second conductive patterns 150a and 150b and between the first and second conductive patterns 150a and 150b (e.g., the portion of the preliminary passivation layer 171 on the protection layer 162 between the first and second conductive patterns 150a and 150b and directly on the upper insulating layer 130).

Next, referring to FIG. 7C, a second deposition process may be performed to increase a thickness of the preliminary passivation layer 171 and thereby to form the first passivation layer 172. The second deposition process may be performed using a high density plasma chemical vapor deposition (HDP-CVD) method.

Figure 8:
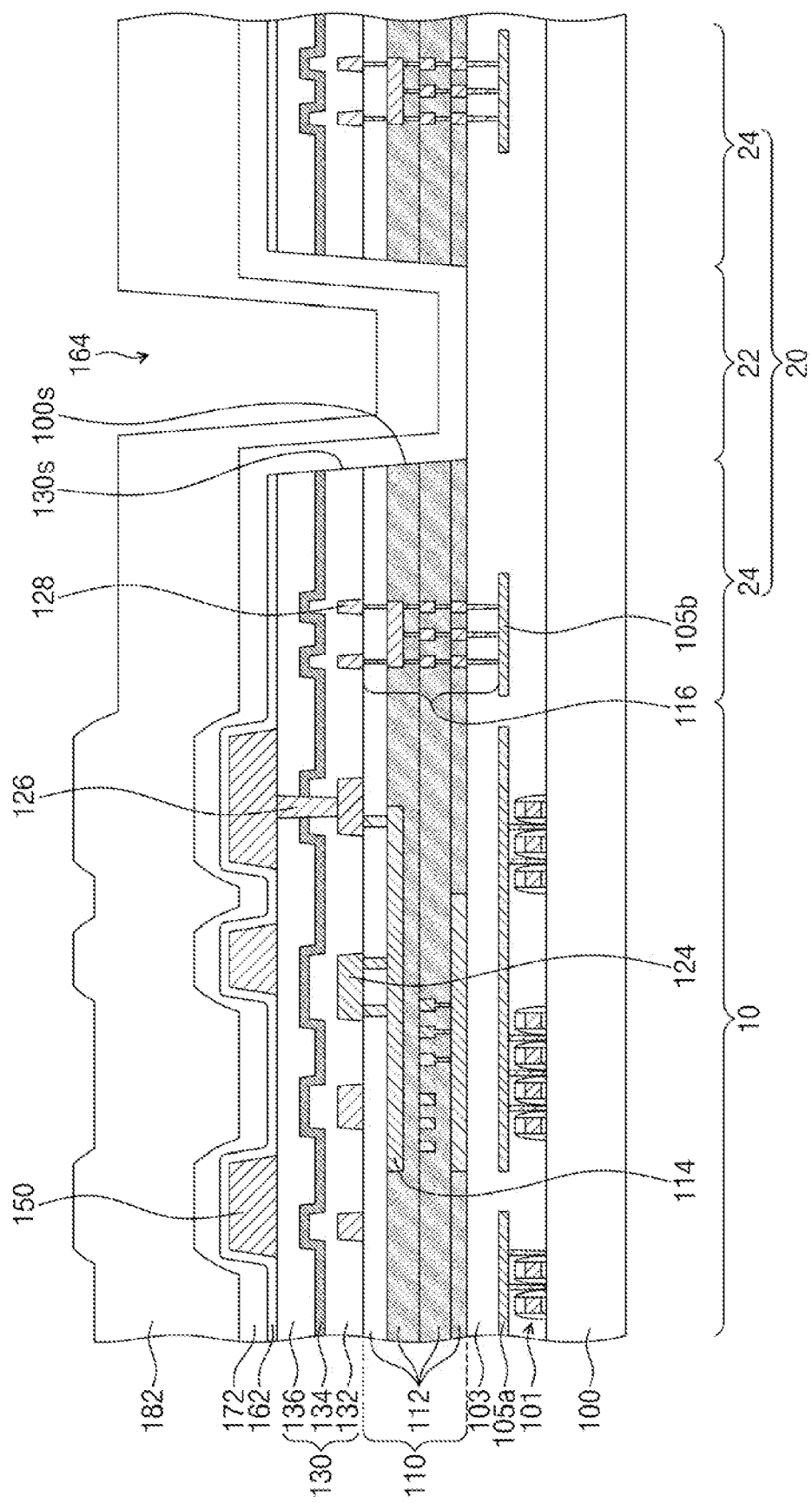
FIGS. 8 to 11 are sectional views, which are taken along the line of FIG. 2, of stages in a method of fabricating semiconductor devices according to an embodiment.

Referring to FIGS. 2 and 8, a second passivation layer 182 may be formed on the first passivation layer 172. The second passivation layer 182 may be formed to fully or completely cover a top surface of the first passivation layer 172. On the chip region 10, the first passivation layer 172 may fill at least a portion of a space between two adjacent ones of the conductive patterns 150. On the scribe line region 20, the second passivation layer 182 may fill a portion of the trench 164. The second passivation layer 182 may be an oxide layer, and may be formed by performing a deposition process using tetraethyl orthosilicate (TEOS) as a source material.

Figure 9:
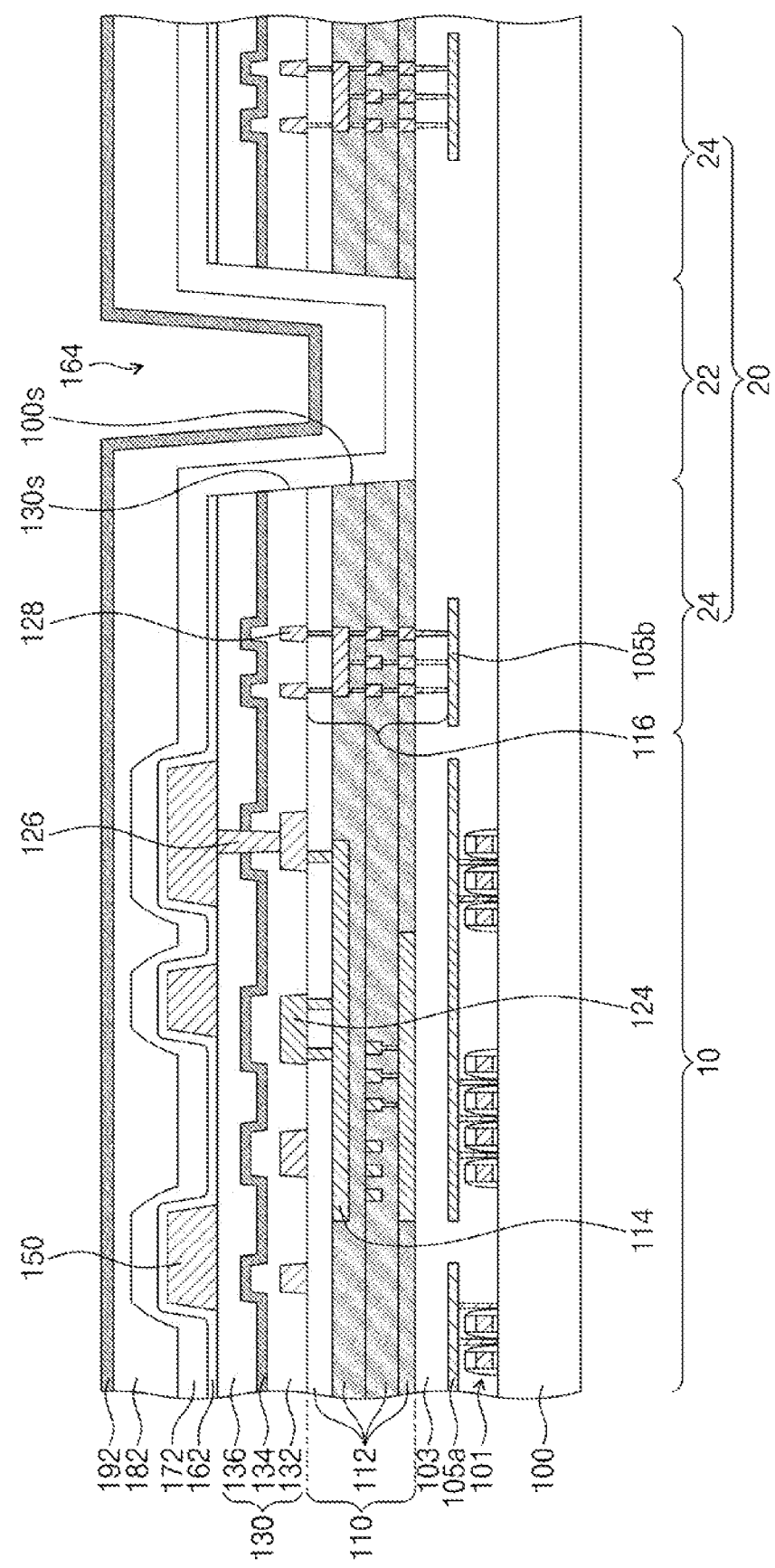

Referring to FIGS. 2 and 9, a third passivation layer 192 may be formed to cover the second passivation layer 182. Before the formation of the third passivation layer 192, a top surface of the second passivation layer 182 may be planarized. The planarization of the top surface of the second passivation layer 182 may be performed using a chemical mechanical polishing (CMP) process. Next, the third passivation layer 192 may be formed by performing a deposition process on the planarized top surface of the second passivation layer 182. The third passivation layer 192 may fill a portion of the trench 164 on the scribe line region 20. The third passivation layer 192 may include a silicon nitride layer or a silicon oxynitride layer.

Figure 10:
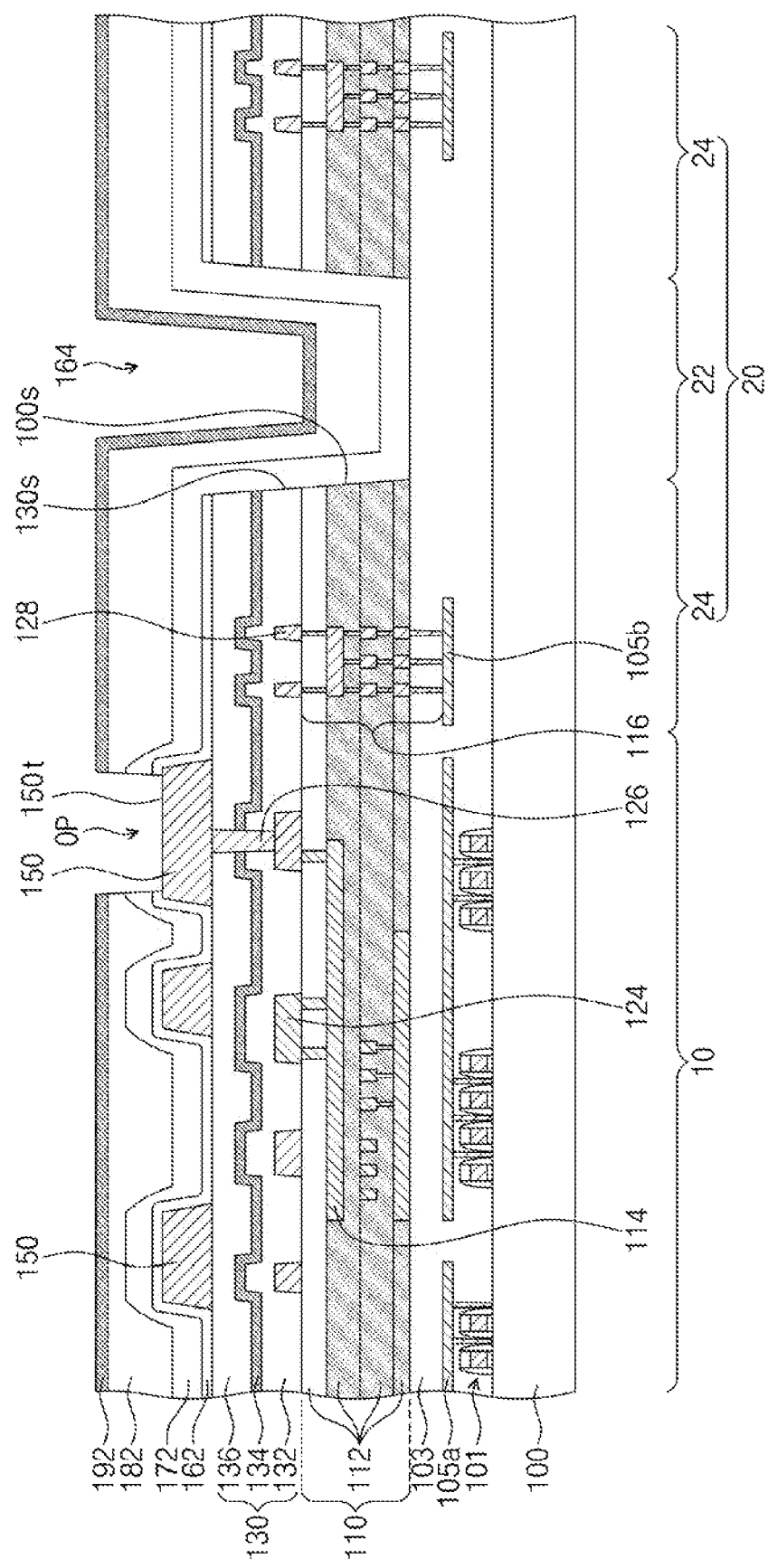

Referring to FIGS. 2 and 10, an opening OP may be formed to expose a top surface 150t of at least one of the conductive patterns 150. The opening OP may have an increasing width with increasing distance from the conductive patterns 150. The formation of the opening OP may include forming a mask pattern on the third passivation layer 192 and anisotropically etching the first to third passivation layers 172, 182, and 192 using the mask pattern as an etch mask. Portions of the conductive patterns 150 exposed by the opening OP may be pad portions to connect the integrated circuit element 101 to an external device. The opening OP may have a rectangular, circular, or polygonal shape. In the case where the opening OP has a rectangular shape, the pad portion of the semiconductor device may have a rectangular shape, as shown in FIG. 2.

Figure 11:
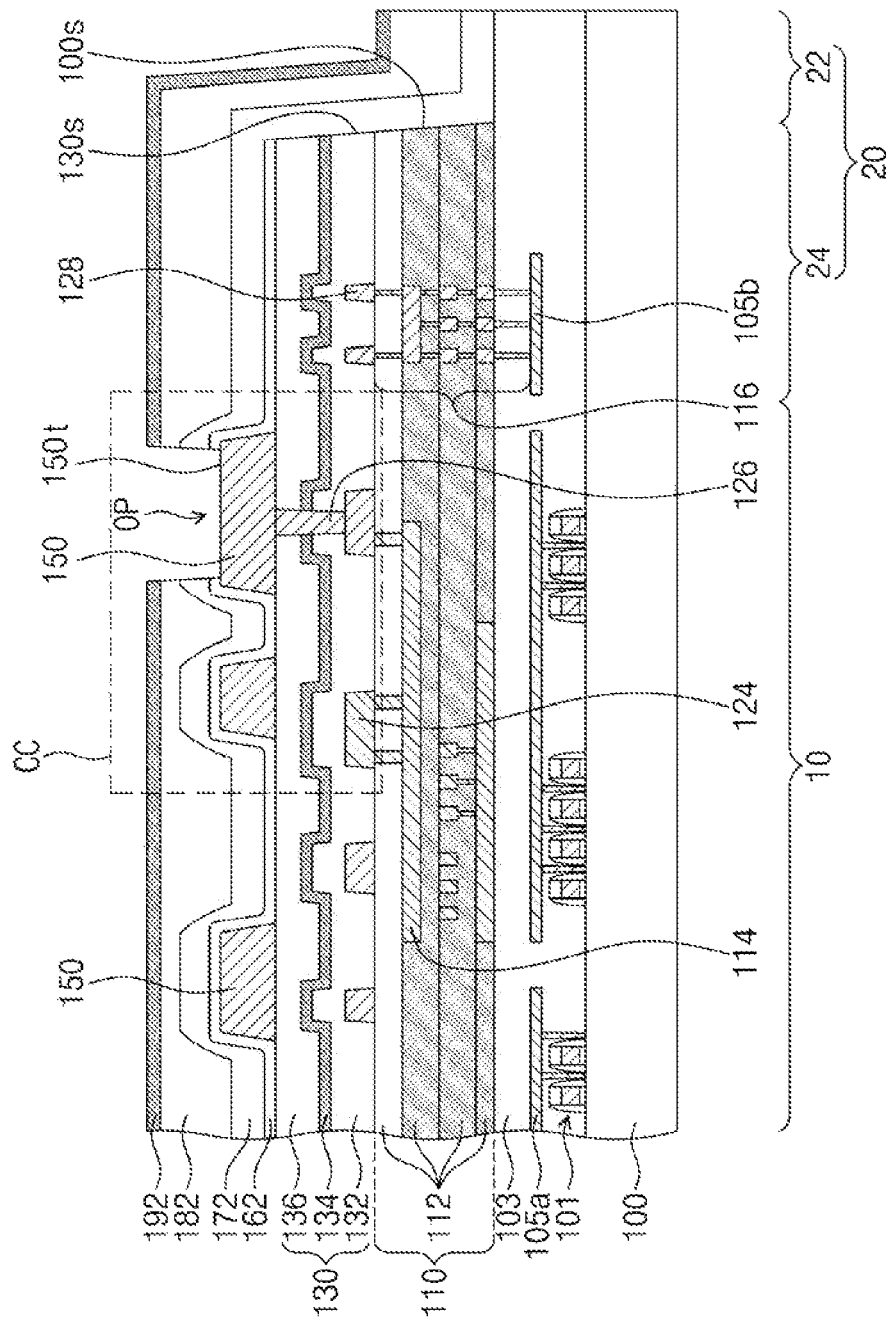
Figure 12A:
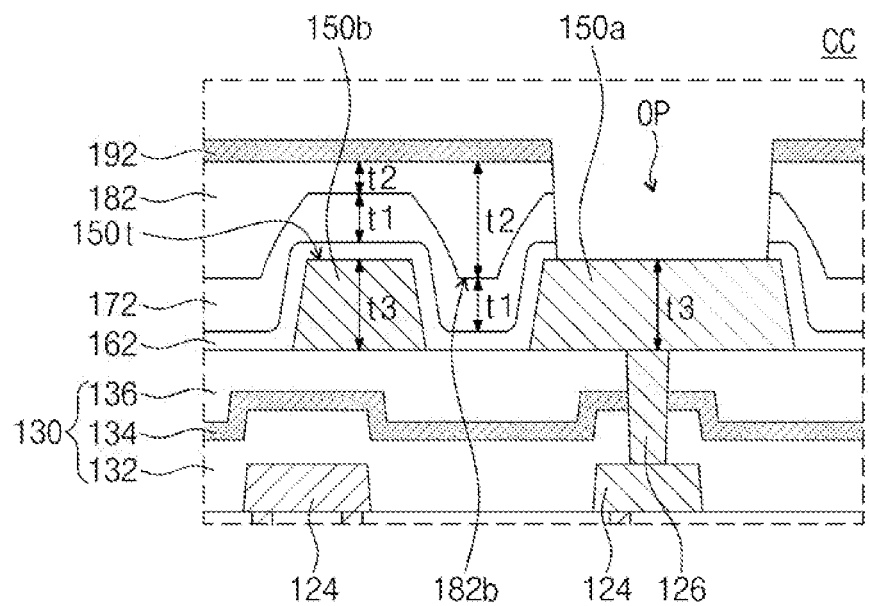
FIGS. 12A and 12B are enlarged sectional views illustrating a portion CC of FIG. 11.
Figure 12B:
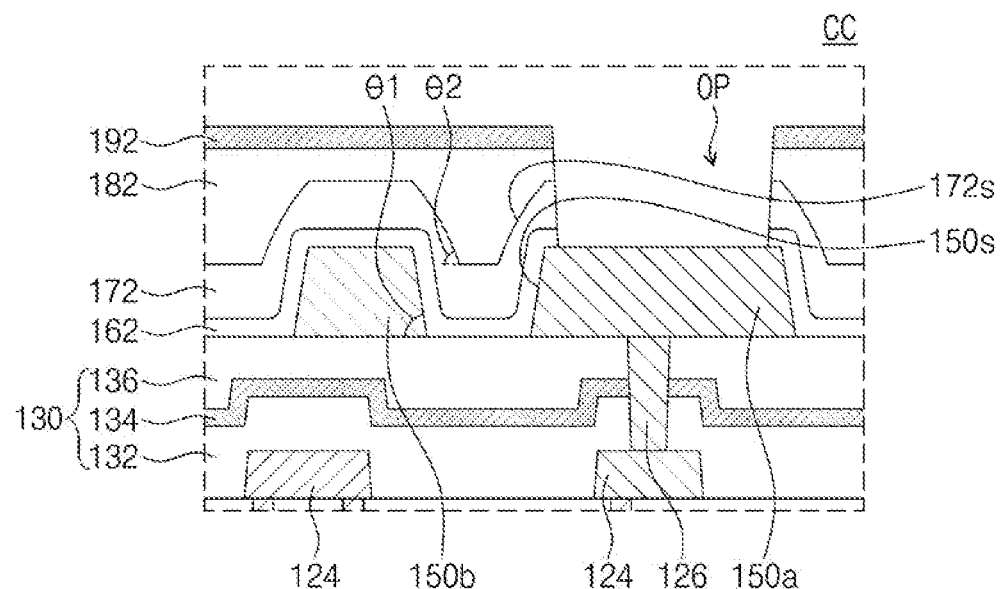

Referring to FIGS. 2 and 11, a sawing process may be performed on the cutting region 22 of the scribe line region 20 to separate the chip regions 10 from each other. At least a portion of the cutting region 22 may be removed by the sawing process. As a result of the sawing process, the substrate 100 may be divided into a plurality of semiconductor chips that are separated from each other. Each of the semiconductor chips may have the chip region 10 and the edge region 24 around the chip region 10. In an implementation, a portion of the cutting region 22 may be left or remain near the edge region 24. The lower and upper insulating layers 112 and 130 on the scribe line region 20 may be partially removed before the sawing process, and it is possible to help prevent the substrate 100 from being incompletely cut or to help prevent thin films from being tore or from being cracked toward the chip region, during the sawing process on the substrate 100.

In an implementation, referring to FIGS. 11 and 12A, the conductive patterns 150 may include the first conductive pattern 150a and the second conductive pattern 150b spaced apart from each other in a direction parallel to the top surface of the substrate 100. The first conductive pattern 150a may be a pad portion whose top surface is partially exposed by the opening OP, and the second conductive pattern 150b may be an interconnection line that is located at a same vertical level as the pad portion. The protection layer 162 may cover the conductive patterns 150a and 150b, and the protection layer 162 may have a constant thickness. A thickness t1 of the first passivation layer 172 and a thickness t2 of the second passivation layer 182 (e.g., in a vertical direction) may not be constant, unlike the thickness of the protection layer 162. In an implementation, at a location on the top surfaces of the first and second conductive patterns 150a and 150b, the thickness t1 of the first passivation layer 172 may be greater than the thickness t2 of the second passivation layer 182. In an implementation, at a location between the first and second conductive patterns 150a and 150b, the thickness t1 of the first passivation layer 172 may be smaller than the thickness t2 of the second passivation layer 182. The first and second conductive patterns 150a and 150b may have a thickness t3 (e.g., in the vertical direction) that is larger than the thickness t1 of the first passivation layer 172 and larger than the thickness t2 of the second passivation layer 182 (e.g., larger than the thickness t2 of the second passivation layer 182 at the location on the top surface of the second conductive pattern 150b), and on the top surface of the first conductive pattern 150a, the thickness t3 of the first conductive pattern 150a may be 1.1 to 1.9 times the thickness t1 of the first passivation layer 172. A thickness of the third passivation layer 192 may be smaller than the thickness t1 of the first passivation layer 172 and smaller than the thickness t2 of the second passivation layer 182.

The second passivation layer 182 may have a bottom surface 182b. A portion of the bottom surface 182b of the second passivation layer 182 positioned between the first and second conductive patterns 150a and 150b may be at a lower vertical level than (e.g., closer to the substrate 100 than) the top surfaces of the first and second conductive patterns 150a and 150b.

Referring to FIGS. 11 and 12B, the first and second conductive patterns 150a and 150b may have inner side surfaces 150s, which are opposite to (e.g., facing) each other. The inner side surfaces 150s of the conductive patterns 150a and 150b may be inclined at an angle with respect to the top surface of the substrate 100. The inner side surfaces 150s of the conductive patterns 150a and 150b may form a first angle θ1 relative to the top surface of the substrate 100. The first passivation layer 172 may have inner side surfaces 172s between the conductive patterns 150a and 150b. The inner side surfaces 172s of the first passivation layer 172 may form a second angle θ2 relative to the top surface of the substrate 100. In an implementation, the second angle θ2 may be smaller than the first angle θ1.

Hereinafter, semiconductor devices according to various embodiments will be described. For concise description, an element previously described with reference to FIGS. 2 to 12B may be identified by the same reference number without repeating an overlapping description thereof.

Figure 13A:
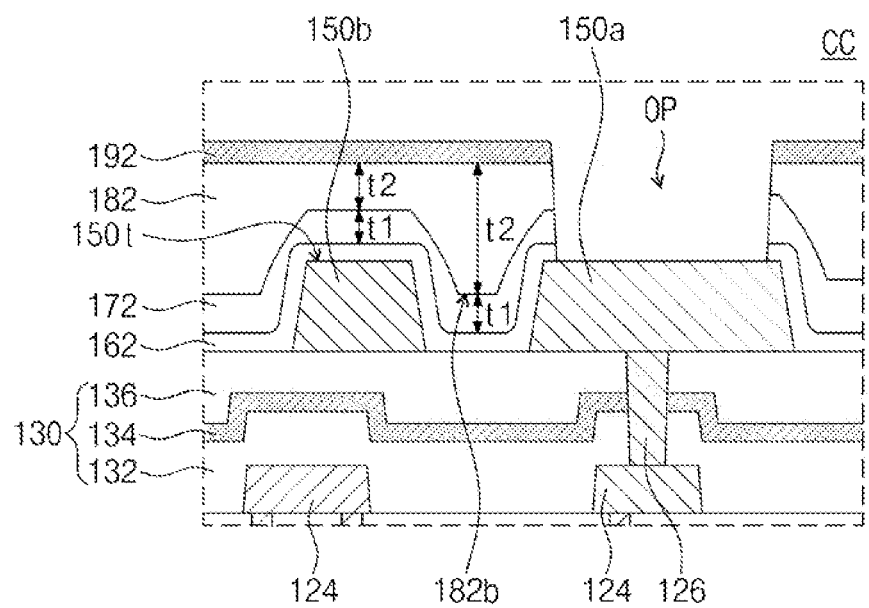
FIGS. 13A and 13B are enlarged sectional views, which correspond to a portion CC of FIG. 11, of a portion of a semiconductor device according to an embodiment.
Figure 13B:
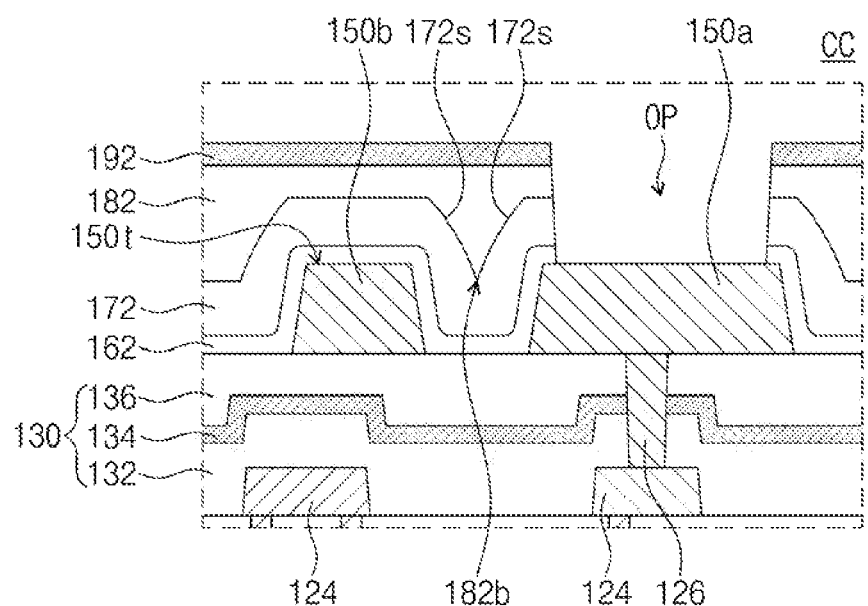

FIGS. 13A and 13B are enlarged sectional views, which correspond to a portion CC of FIG. 11, of a portion of a semiconductor device according to an embodiment.

Referring to FIG. 13A, on the top surfaces 150t of the first and second conductive patterns 150a and 150b, the thickness t2 of the second passivation layer 182 may be larger than the thickness t1 of the first passivation layer 172.

Referring to FIG. 13B, the inner side surfaces 172s of the first passivation layer 172 may be in contact with each other. In an implementation, a bottommost surface 182b of the second passivation layer 182 (e.g., a portion of the second passivation layer 182 closest to the substrate 100) may be positioned between the first and second conductive patterns 150a and 150b, and may have a sharp shape (e.g., may come to a point).

Figure 14:
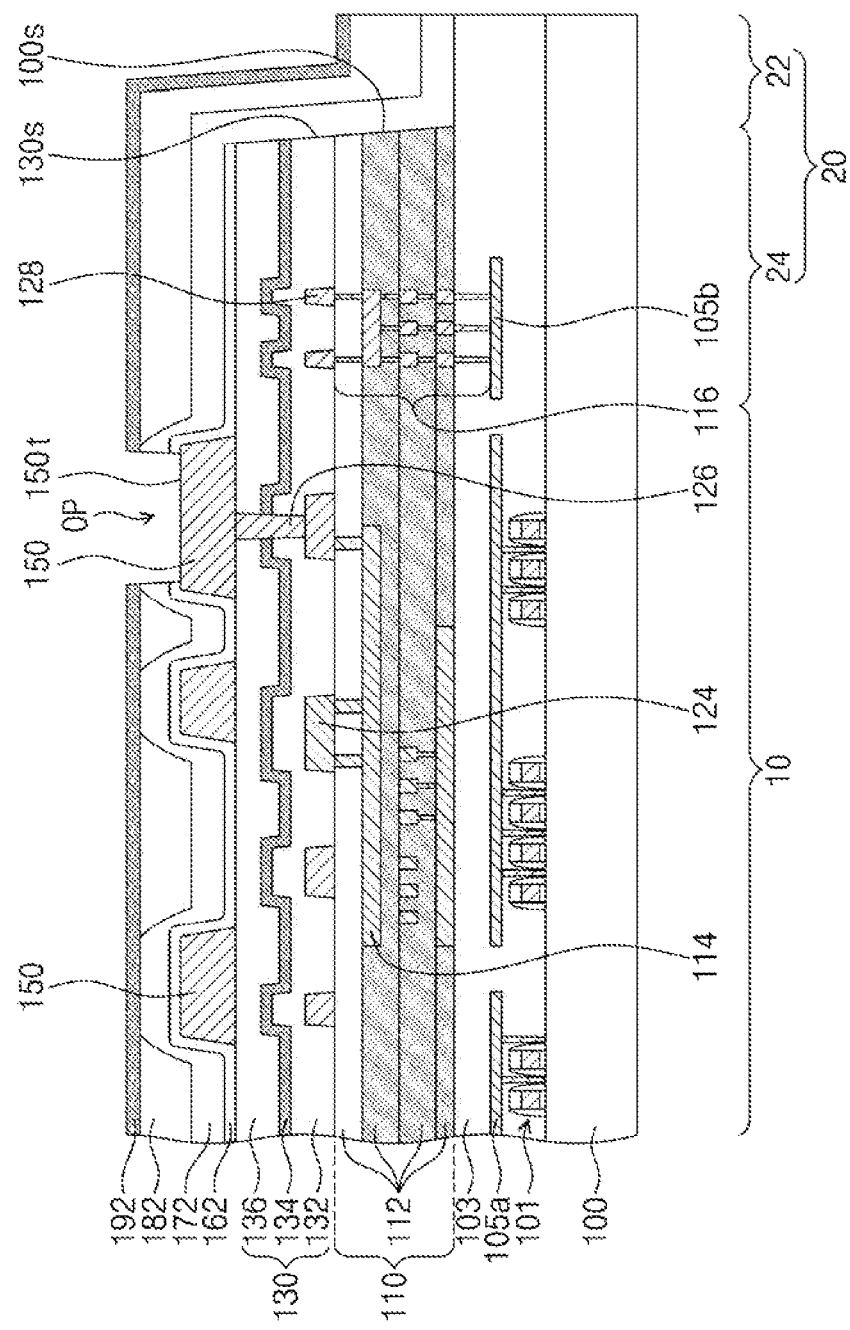
FIGS. 14 and 15 are sectional views, which are taken along the line I-I' of FIG. 2, of a semiconductor device according to an embodiment.
Figure 15:
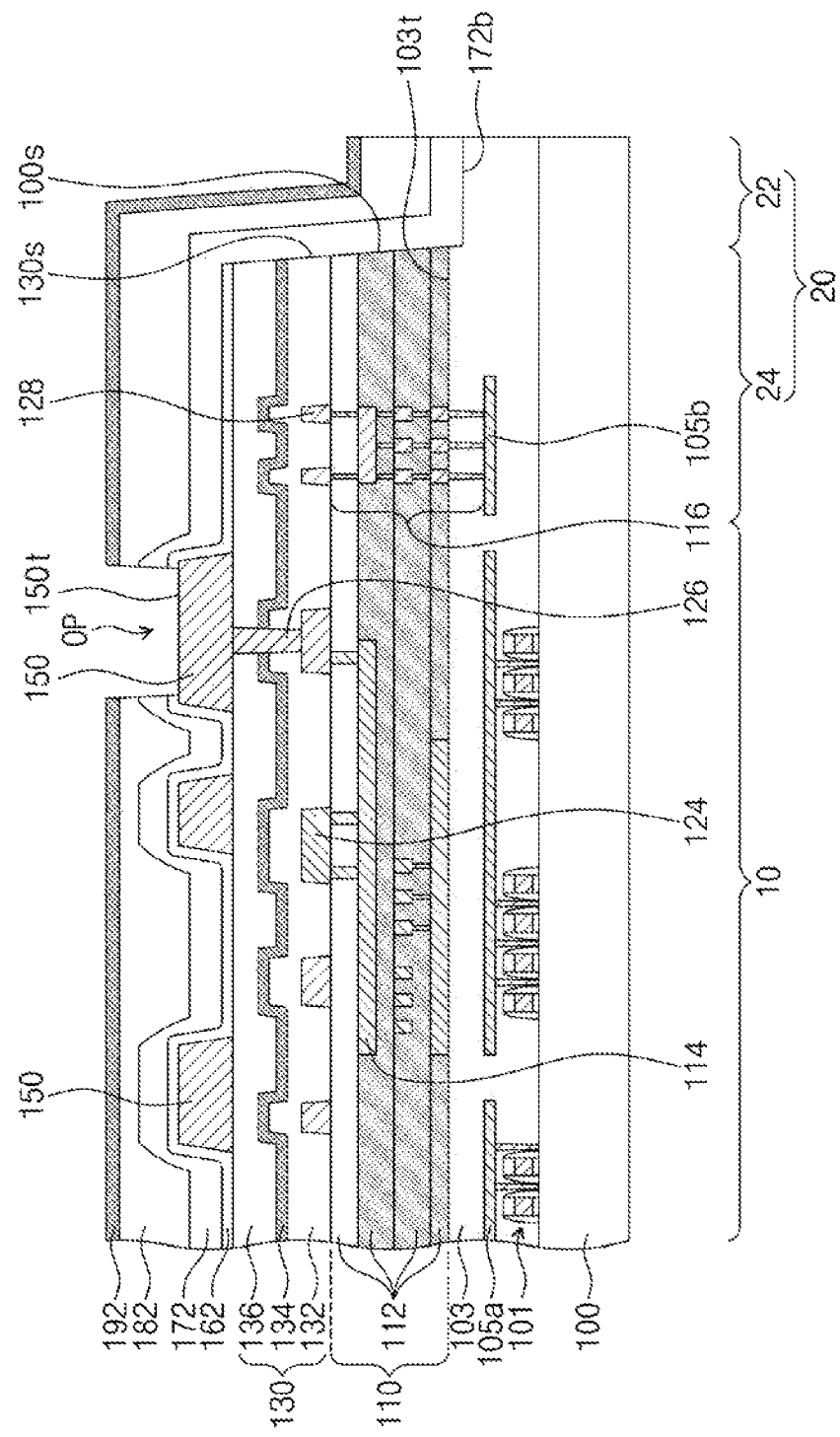

FIGS. 14 and 15 are sectional views, which are taken along the line I-I' of FIG. 2, of a semiconductor device according to an embodiment.

Referring to FIG. 14, on the top surface of the conductive patterns 150, the first passivation layer 172 may be in contact (e.g., direct contact) with the third passivation layer 192. In an implementation, a planarization process on the second passivation layer 182 described with reference to FIG. 9 may be performed to expose the top surface of the first passivation layer 172. The second passivation layer 182 may not be exposed to the opening OP.

Referring to FIG. 15, a top surface 103t of the interlayer insulating layer 103 may be lower (e.g., closer to the substrate 100) on the cutting region 22 than it is on the chip region 10 and the edge region 24. In an implementation, the bottommost surface 172b of the first passivation layer 172 on the cutting region 22 may be positioned at a vertical level that is lower than the topmost surface (e.g., 103t) of the interlayer insulating layer 103.

Figure 16:
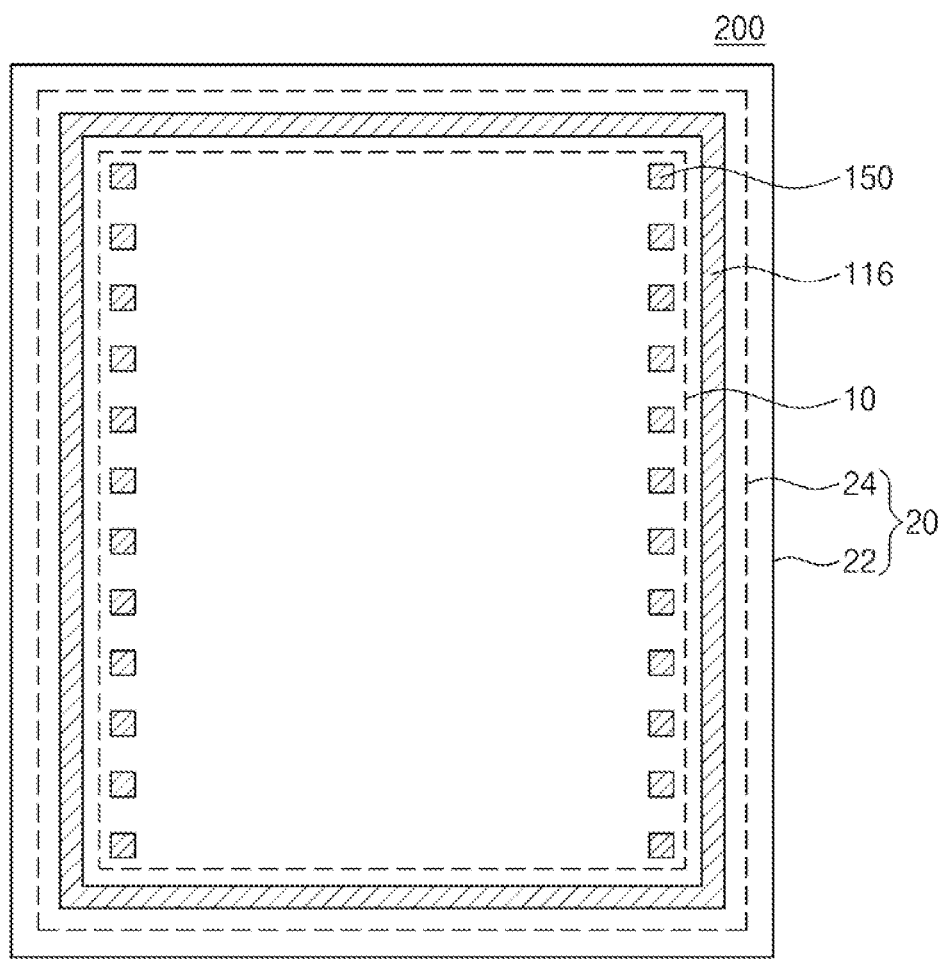
FIG. 16 is a plan view of a semiconductor chip that is separated from a semiconductor device according to an embodiment.
Figure 17:
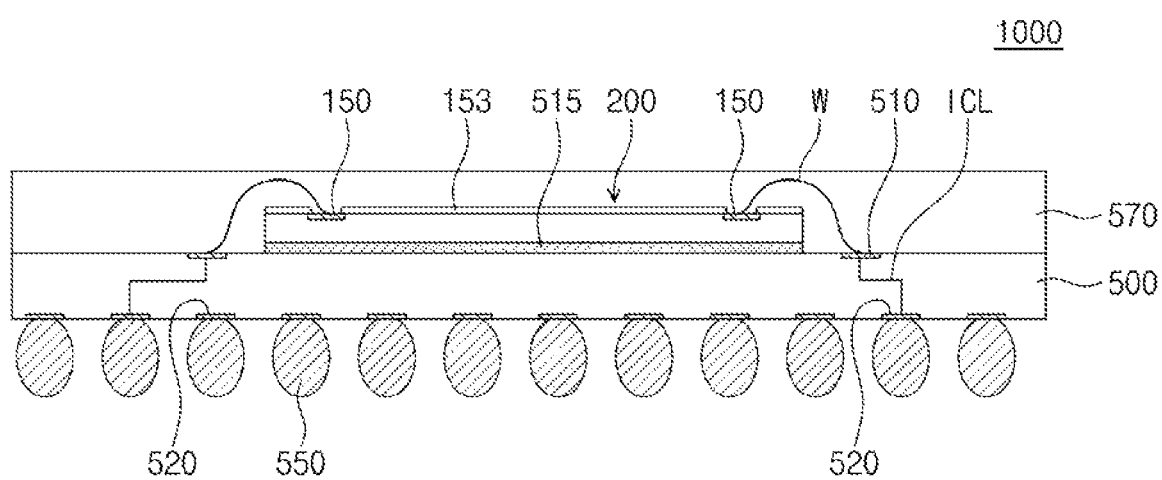
FIG. 17 is a sectional view of a semiconductor package including a semiconductor chip according to an embodiment.

FIG. 16 is a plan view of a semiconductor chip that is separated from a semiconductor device according to an embodiment. FIG. 17 is a sectional view of a semiconductor package including a semiconductor chip according to an embodiment.

Referring to FIG. 16, a semiconductor chip 200, which has been divided by the sawing process on the substrate 100, may include the chip region 10 and the edge region 24 around the chip region 10. A portion of the cutting region 22 may be left near or around the edge region 24. The cutting region 22 may enclose the edge region 24, and in this case, the cutting region 22 and the edge region 24 may constitute the scribe line region 20. The conductive patterns 150 may be in or on an outer edge region of the chip region 10. The dam structure 116 may be on the edge region 24 to enclose the chip region 10.

Referring to FIG. 17, a semiconductor package 1000 may include the semiconductor chip 200, a package substrate 500, outer coupling terminals 550, and a mold layer 570. In an implementation, the semiconductor chip 200, which is fabricated by the afore-described fabrication method, may be mounted on the package substrate 500.

The semiconductor chip 200 may include the chip pads 150 exposed by a passivation layer 153. The passivation layer 153 may include the first to third passivation layers 172, 182, and 192 described above. The chip pads 150 may include data pads to input or output data signals, command/address pads to input or output command signals and address signals, or power and ground pads, to which ground and power voltages may be respectively applied.

In an implementation, the package substrate 500 may be a printed circuit board, a flexible substrate, or a tape substrate. In an implementation, the package substrate 500 may include a flexible or rigid printed circuit board, in which internal interconnection lines are provided, or a combination thereof.

The package substrate 500 may have a top surface and a bottom surface, which are opposite to each other, and may include bonding pads 510 and outer coupling pads 520. The bonding pads 510 may be on the top surface of the package substrate 500, and the outer coupling pads 520 may be on the bottom surface of the package substrate 500. The bonding pads 510 and the outer coupling pads 520 may be connected to each other through the internal interconnection lines. The semiconductor chip 200 may be on a center region of the top surface of the package substrate 500, and an adhesive layer 515 may be between the semiconductor chip 200 and the package substrate 500.

The bonding pads 510 may be connected to the chip pads 150 of the semiconductor chip 200 through wires W. The outer coupling pads 520 may be connected to the bonding pads 510 through internal interconnection lines ICL.

The mold layer 570 may be on the top surface of the package substrate 500 to cover the semiconductor chip 200. The mold layer 570 may include an epoxy molding compound.

The outer coupling terminals 550 may be attached to the outer coupling pads 520 on the bottom surface of the package substrate 500. The semiconductor package 1000 may be connected to external electronic devices through the outer coupling terminals 550.

Figure 18:
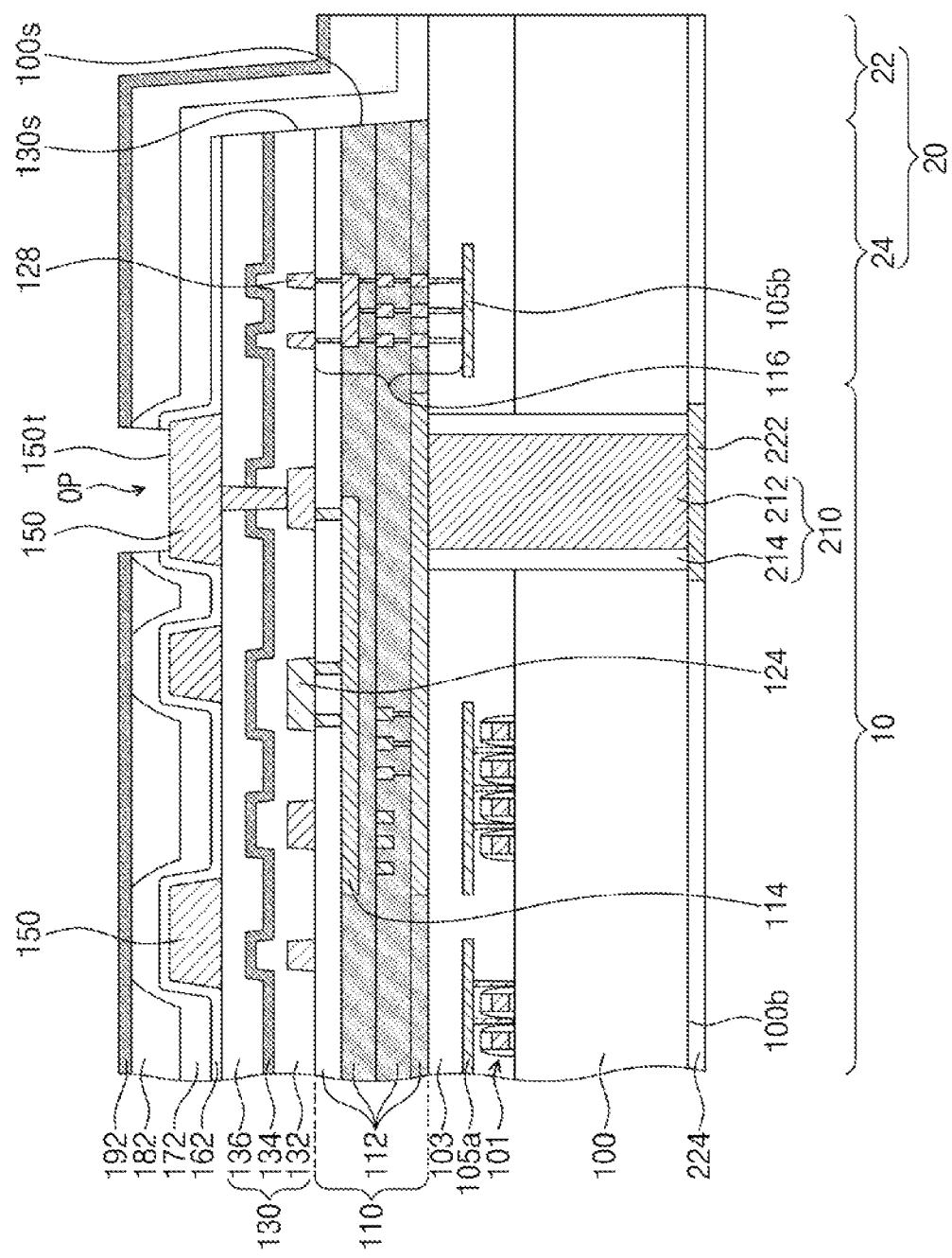
FIG. 18 is a sectional view, which corresponds to the line of FIG. 2, of a semiconductor device according to an embodiment.
Figure 19:
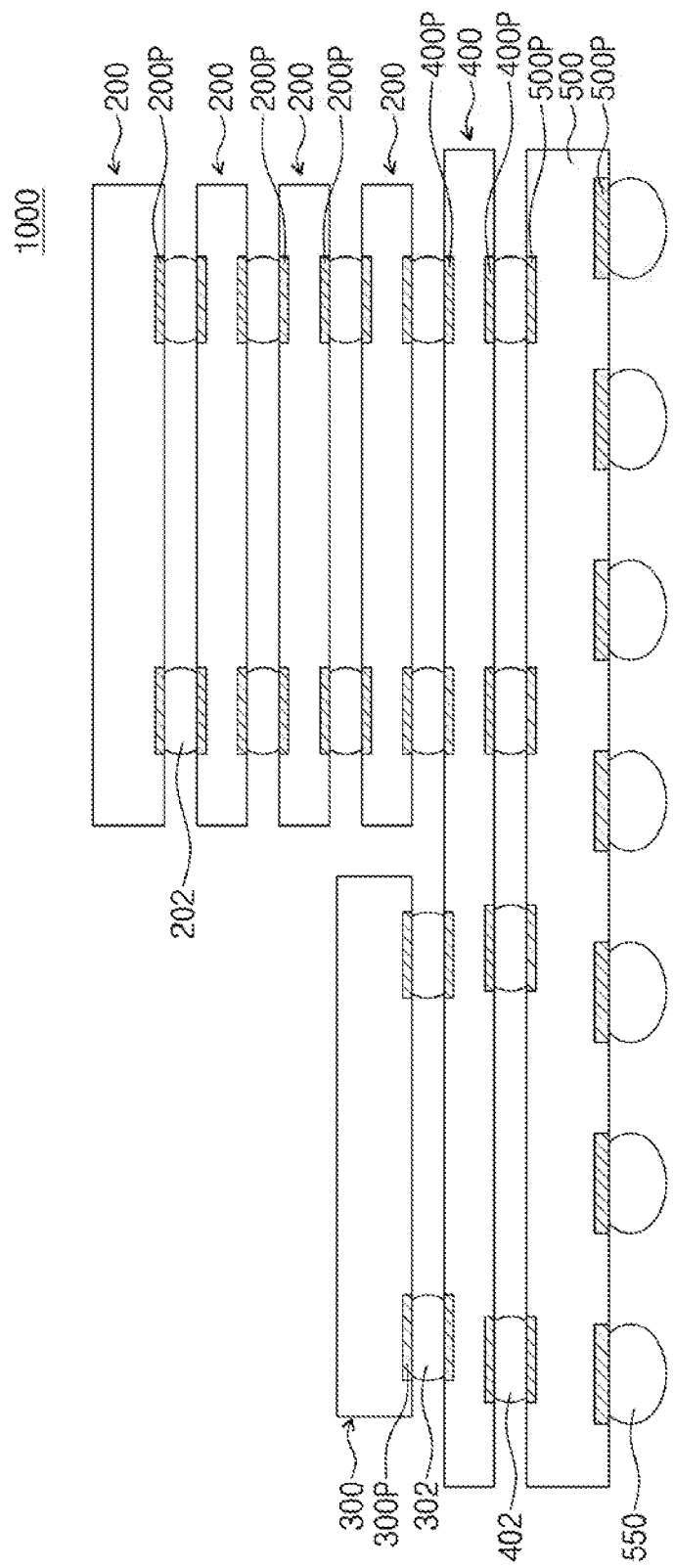
FIG. 19 is a sectional view of a semiconductor package including a semiconductor chip according to an embodiment.

FIG. 18 is a sectional view, which corresponds to the line I-I' of FIG. 2, of a semiconductor device according to an embodiment. FIG. 19 is a sectional view of a semiconductor package including a semiconductor chip according to an embodiment. For concise description, a previously described element may be identified by the same reference number without repeating an overlapping description thereof.

Referring to FIG. 18, a semiconductor chip according to an embodiment may include a penetration interconnection structure 210 and a lower pad 222. The penetration interconnection structure 210 may penetrate the substrate 100 and the interlayer insulating layer 103 and may be connected to the internal interconnection line 114. The penetration interconnection structure 210 may include a conductive layer 212 and a via insulating layer 214. The conductive layer 212 may be formed of or include a metallic material, e.g., W, Al, Ti, Ta, Co, or Cu. The via insulating layer 214 may be between the conductive layer 212 and the substrate 100 and between the conductive layer 212 and the interlayer insulating layer 103. The via insulating layer 214 may be formed of or include, e.g., silicon oxide. The lower pad 222 may be electrically connected to the internal interconnection lines 114 through the conductive layer 212 of the penetration interconnection structure 210. Side surfaces of the lower pad 222 may be covered with a lower passivation layer 224, which may be provided to cover a bottom surface 100b of the substrate 100.

Referring to FIG. 19, a semiconductor package according to an embodiment may be high bandwidth memory (HBM) package. The semiconductor package 1000 may include the semiconductor chips 200, a process chip 300, an interposer 400, and the package substrate 500.

The semiconductor chips 200, which may be fabricated by the afore-described method, may be mounted on the package substrate 500. The semiconductor chips 200 may include memory chips and/or logic chips. In an implementation, the bottommost one of the semiconductor chips 200 may be a logic chip. The logic chip may be, e.g., a microprocessor, an analog device, or a digital signal processor. The semiconductor chips 200, except for the bottommost semiconductor chip 200, may be memory chips. In an implementation, the memory chip may include volatile memory chips (e.g., dynamic random access memory (DRAM) and static random access memory (SRAM) chips) or nonvolatile memory chips (e.g., phase-change random access memory (PRAM), magnetoresistive random access memory (MRAM), ferroelectric random access memory (FeRAM), or resistive random access memory (RRAM) chips).

The semiconductor chips 200 may include pads 200P on top and bottom surfaces thereof. The pads 200P may be one of the lower pad 222 and the chip pad 150 shown in FIG. 18. In an implementation, the pad on the top surface of the semiconductor chip 200 may be the lower pad 222, and the pad on the bottom surface of the semiconductor chip 200 may be the chip pad 150. In an implementation, the pad on the top surface of the semiconductor chip 200 may be the chip pad 150, and the pad on the bottom surface of the semiconductor chip 200 may be the lower pad 222. The semiconductor chips 200 may be electrically connected to the interposer 400 through coupling terminals 202.

The interposer 400 may be between the semiconductor chips 200 and the package substrate 500. The interposer 400 may include pads 400P on top and bottom surfaces thereof. The interposer 400 may electrically connect the process chip 300 and the semiconductor chips 200 to the package substrate 500 through coupling terminals 402 and 302. The process chip 300 may be, e.g., a micro-processor unit (MPU) or a graphic processor unit (GPU).

The outer coupling terminals 550 may be attached to the outer coupling pads 500P on the bottom surface of the package substrate 500. The semiconductor package 1000 may be connected to an external electronic device through the outer coupling terminals 550.

By way of summation and review, as the electronic industry advances, a semiconductor device may have a high integration density and a high operation speed. A semiconductor chip may include a re-distribution layer, which is connected to the chip pads and is used to change positions of pads, which are placed at specific positions in the semiconductor chip.

According to an embodiment, a passivation layer, which covers the topmost metal lines and pads on a chip region of a semiconductor chip, may have a multi-layered structure, and it is possible to prevent a crack or a process failure from occurring in the semiconductor chip and to increase mechanical durability of the semiconductor chip.

One or more embodiments may provide a semiconductor device including a redistribution pad.

One or more embodiments may provide a semiconductor device including a plurality of stacked passivation layers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a chip region and an edge region around the chip region;
   integrated circuit elements on the chip region;
   an interlayer insulating layer covering the integrated circuit elements;
   an interconnection structure having internal interconnection lines on the interlayer insulating layer, the interconnection structure having a side surface on the edge region;
   a first conductive pattern and a second conductive pattern on the interconnection structure, wherein the first conductive pattern and the second conductive pattern are each electrically connected to the internal interconnection lines, wherein the first conductive pattern and the second conductive pattern are laterally spaced apart from each other in a direction parallel to a top surface of the substrate, and wherein the first conductive pattern has a bottom surface that is on a same vertical level as a bottom surface of the second conductive pattern;
   a first passivation layer covering the first conductive pattern and the second conductive pattern and the side surface of the interconnection structure; and
   a second passivation layer on the first passivation layer, wherein:
   the second passivation layer includes a second insulating material, the first passivation layer includes a first insulating material, and the second insulating material of the second passivation layer is different from the first insulating material of the first passivation layer, and
   in a region between the first conductive pattern and the second conductive pattern, the second passivation layer has a bottom surface that is located at a vertical level lower than a top surface of the first conductive pattern.

2. The semiconductor device as claimed in claim 1, wherein, on the top surface of the first conductive pattern, the first passivation layer has a thickness that is smaller than a thickness of the first conductive pattern.

3. The semiconductor device as claimed in claim 2, wherein:
   the first conductive pattern has a thickness,
   the first passivation layer on the top surface of the first conductive pattern has a thickness, and
   the thickness of the first conductive pattern ranges from 1.1 to 1.9 times the thickness of the first passivation layer.

4. The semiconductor device as claimed in claim 1, wherein:
   the first passivation layer has an inner side surface between the first conductive pattern and the second conductive pattern, and
   the inner side surface has an inclination angle that is smaller than an inclination angle of a side surface of the first conductive pattern facing the second conductive pattern.

5. The semiconductor device as claimed in claim 1, wherein each of the first passivation layer and the second passivation layer has an opening that exposes a top surface of the first conductive pattern.

6. The semiconductor device as claimed in claim 1, further comprising a protection layer between the first passivation layer and the first and second conductive patterns,
   wherein the protection layer has a thickness that is smaller than a thickness of the first passivation layer.

7. The semiconductor device as claimed in claim 1, further comprising a third passivation layer on the second passivation layer,
   wherein the third passivation layer has a thickness that is smaller than a thickness of the first passivation layer and smaller than a thickness of the second passivation layer.

8. The semiconductor device as claimed in claim 7, wherein a top surface of the second passivation layer is in contact with a bottom surface of the third passivation layer.

9. The semiconductor device as claimed in claim 1, further comprising a penetration interconnection structure penetrating the substrate and the interlayer insulating layer, the penetration interconnection structure being connected to the internal interconnection lines.

10. The semiconductor device as claimed in claim 1, wherein:
    the first passivation layer includes a high density plasma (HDP) oxide layer, and
    the second passivation layer includes a tetraethyl orthosilicate (TEOS) layer.

11. A semiconductor device, comprising:
    a substrate;
    integrated circuit elements on the substrate;
    an interlayer insulating layer covering the integrated circuit elements;
    an interconnection structure on the interlayer insulating layer, the interconnection structure including internal interconnection lines connected to the integrated circuit elements;
    conductive patterns on the interconnection structure, the conductive patterns being electrically connected to the internal interconnection lines;
    a first passivation layer covering the conductive patterns and a side surface of the interconnection structure; and
    a second passivation layer on the first passivation layer, wherein:
    the second passivation layer includes an insulating material, the first passivation layer includes an insulating material, and the insulating material of the second passivation layer is different from the insulating material of the first passivation layer,
    in a region between the conductive patterns, the first passivation layer has a thickness that is smaller than a thickness of the second passivation layer, and
    in a region on a top surface of each of the conductive patterns, the first passivation layer has a thickness that is larger than a thickness of the second passivation layer.

12. The semiconductor device as claimed in claim 11, wherein, in the region between the conductive patterns, the second passivation layer has a bottom surface that is located at a vertical level lower than the top surface of each of the conductive pattern.

13. The semiconductor device as claimed in claim 11, further comprising a penetration interconnection structure penetrating the substrate and the interlayer insulating layer, the penetration interconnection structure being connected to the internal interconnection lines.

14. The semiconductor device as claimed in claim 11, further comprising a protection layer between the conductive patterns and the first passivation layer,
    wherein the protection layer has a thickness that is smaller than that of the first passivation layer.

15. The semiconductor device as claimed in claim 11, further comprising a third passivation layer on the second passivation layer, wherein the third passivation layer has a thickness that is smaller than that of the first passivation layer and smaller than that of the second passivation layer.

16. A semiconductor device, comprising:

a substrate including a chip region and an edge region around the chip region;

integrated circuit elements on the chip region of the substrate;

an interlayer insulating layer covering the integrated circuit elements;

an interconnection structure on the interlayer insulating layer, the interconnection structure having a side surface on the edge region of the substrate;

conductive patterns on a top surface of the interconnection structure, wherein the conductive patterns are each electrically connected to internal interconnection lines in the interconnection structure, wherein the conductive patterns are laterally spaced apart from each other in a direction parallel to a top surface of the substrate, and wherein the conductive patterns have bottom surfaces that are on a same vertical level as each other;

a protection layer covering the conductive patterns; and passivation layers on the protection layer, the passivation layers having an opening partially exposing top surfaces of the conductive patterns, wherein the passivation layers include:

a first passivation layer on the protection layer and covering at least a portion of the side surface of the interconnection structure;

a second passivation layer on the first passivation layer and including an insulating material different from that of the first passivation layer; and a third passivation layer on the second passivation layer and including an insulating material different from that of the first passivation layer and the second passivation layer, and wherein the conductive patterns have a thickness that is larger than a thickness of each of the first to third passivation layers.

17. The semiconductor device as claimed in claim 16, wherein, in a region between the conductive patterns, the second passivation layer has a bottom surface that is located at a vertical level lower than the top surface of each of the conductive pattern.

18. The semiconductor device as claimed in claim 16, further comprising a penetration interconnection structure penetrating the substrate and the interlayer insulating layer, the penetration interconnection structure being connected to the internal interconnection lines.

19. The semiconductor device as claimed in claim 16, wherein:

the first passivation layer has an inner side surface between the conductive patterns, and the inner side surface has an inclination angle that is smaller than an inclination angle of a side surface of the conductive patterns.

20. The semiconductor device as claimed in claim 16, wherein:

the first passivation layer includes a high density plasma (HDP) oxide layer, and the second passivation layer includes a tetraethyl orthosilicate (TEOS) layer.

* * * * *